United States Patent
Islam

(10) Patent No.: US 6,693,737 B2
(45) Date of Patent: Feb. 17, 2004

(54) DISPERSION COMPENSATING NONLINEAR POLARIZATION AMPLIFIERS

(75) Inventor: Mohammed N. Islam, Allen, TX (US)

(73) Assignee: Xtera Communications, Inc., Allen, TX (US)

(*) Notice: Subject to any disclaimer, the term of this patent is extended or adjusted under 35 U.S.C. 154(b) by 0 days.

(21) Appl. No.: 09/800,085

(22) Filed: Mar. 5, 2001

(65) Prior Publication Data

US 2002/0067537 A1 Jun. 6, 2002

Related U.S. Application Data

(60) Continuation-in-part of application No. 09/766,489, filed on Jan. 19, 2001, which is a continuation-in-part of application No. 09/765,972, filed on Jan. 19, 2001, now Pat. No. 6,600,592, and a continuation of application No. 09/760,201, filed on Jan. 12, 2001, which is a division of application No. 09/558,300, filed on Apr. 25, 2000, now Pat. No. 6,239,903, which is a division of application No. 09/046,900, filed on Mar. 24, 1998, now Pat. No. 6,101,024.

(51) Int. Cl.$^7$ ............... H01S 3/00; G02B 6/26
(52) U.S. Cl. ............... 359/334; 359/337.5; 359/341.3; 359/341.5; 372/3; 372/6
(58) Field of Search ............... 359/334, 337.5, 359/341.31, 341.5; 372/3, 6

(56) References Cited

U.S. PATENT DOCUMENTS

| | | | |
|---|---|---|---|
| 3,772,528 A | 11/1973 | Anderson | 307/88.3 |
| 4,616,898 A | 10/1986 | Hicks, Jr. | 350/96.15 |
| 4,699,452 A | 10/1987 | Mollenauer et al. | 350/96.16 |
| 4,720,684 A | 1/1988 | Byron | 330/4.3 |
| 4,923,291 A | 5/1990 | Edagawa et al. | 350/389 |
| 4,932,739 A | 6/1990 | Islam | 350/96.15 |

(List continued on next page.)

FOREIGN PATENT DOCUMENTS

| | | | |
|---|---|---|---|
| EP | 0 421 675 A2 | 9/1990 | H04B/10/16 |
| EP | 0 903 877 A2 | 3/1999 | H04B/10/18 |
| EP | 1 054 489 A2 | 11/2000 | |
| EP | 1 180 860 A1 | 2/2001 | H04B/10/17 |
| JP | 58208731 A | 5/1982 | G02F/1/35 |
| JP | 0 9 197452 | 7/1997 | G02F/1/35 |
| WO | 96/16612 A1 | 6/1996 | A61F/2/08 |
| WO | 98/42088 A1 | 9/1998 | H04B/10/17 |
| WO | 99/49580 A2 | 9/1999 | |
| WO | 99/62407 A1 | 12/1999 | A61B/17/04 |
| WO | 99/66607 A2 | 12/1999 | |
| WO | 00/49721 A2 | 8/2000 | |

OTHER PUBLICATIONS

Hiroji Masuda and Shingo Kawal, Ultra Wide–Band Raman Amplification With A Total Gain–Bandwidth of 132 nm Of Two Gain–Bands Around 1.5 $\mu$m, ECOC '99, Nice, France, pp. II–146–II–147, Sep. 26–30, 1999.

Sugizaki, et al., Slope Compensating DCF for S–band Raman Amplifier, OSA TOPS vol. 60, Optical Amplifiers and Their Applications, Nigel Jolley, John D. Minelly, and Yoshiaki Nakano, eds., 2001 Optical Society of American, pp. 49–53, 2001.

(List continued on next page.)

Primary Examiner—Nelson Moskowitz
(74) Attorney, Agent, or Firm—Baker Botts L.L.P.

(57) ABSTRACT

A broadband nonlinear polarization amplifier includes an input port for inputting an optical signal having a wavelength $\lambda$. A distributed gain medium receives and amplifiers the optical signal through nonlinear polarization. The distributed gain medium has zero-dispersion at wavelength $\lambda_0$. A magnitude of dispersion at $\lambda$ is less than 50 ps/nm-km. One or more semiconductor lasers are operated at wavelengths $\lambda_p$ for generating a pump light to pump the distributed gain medium. An output port outputs the amplified optical signal.

52 Claims, 12 Drawing Sheets

U.S. PATENT DOCUMENTS

| | | | |
|---|---|---|---|
| 4,952,059 A | 8/1990 | Desurvire et al. | 356/350 |
| 4,995,690 A | 2/1991 | Islam | 350/96.15 |
| 5,020,050 A | 5/1991 | Islam | 370/4 |
| 5,078,464 A | 1/1992 | Islam | 385/122 |
| 5,101,456 A | 3/1992 | Islam | 385/27 |
| 5,115,488 A | 5/1992 | Islam et al. | 385/129 |
| 5,224,194 A | 6/1993 | Islam | 385/122 |
| 5,251,642 A | 10/1993 | Handlos | 128/774 |
| 5,369,519 A | 11/1994 | Islam | 359/173 |
| 5,485,536 A | 1/1996 | Islam | 385/31 |
| 5,559,920 A | 9/1996 | Chraplyvy et al. | 385/123 |
| 5,664,036 A | 9/1997 | Islam | 385/31 |
| 5,689,596 A | 11/1997 | Evans | 385/27 |
| 5,778,014 A | 7/1998 | Islam | 372/6 |
| 5,790,300 A | 8/1998 | Zediker et al. | 359/334 |
| 5,796,909 A | 8/1998 | Islam | 385/147 |
| 5,798,853 A | 8/1998 | Watanabe | 359/160 |
| 5,815,518 A | 9/1998 | Reed et al. | 372/6 |
| 5,905,838 A | 5/1999 | Judy et al. | 385/123 |
| 5,959,750 A | 9/1999 | Eskildsen et al. | 359/134 |
| 5,978,130 A | 11/1999 | Fee et al. | 359/341 |
| 6,008,933 A | 12/1999 | Grubb et al. | 359/341 |
| 6,043,927 A | 3/2000 | Islam | 359/332 |
| 6,052,393 A | 4/2000 | Islam | 372/6 |
| 6,072,601 A | 6/2000 | Toyohara | 358/484 |
| 6,081,355 A | 6/2000 | Sharma et al. | 359/110 |
| 6,081,366 A | 6/2000 | Kidorf et al. | 359/341 |
| 6,088,152 A | 7/2000 | Berger et al. | 359/334 |
| 6,101,024 A * | 8/2000 | Islam et al. | 359/334 |
| 6,151,160 A | 11/2000 | Ma et al. | 359/341 |
| 6,163,636 A | 12/2000 | Stentz et al. | 385/24 |
| 6,191,854 B1 | 2/2001 | Grasso et al. | 359/124 |
| 6,191,877 B1 | 2/2001 | Chraplyvy et al. | 359/124 |
| 6,205,268 B1 * | 3/2001 | Chraplyvy et al. | 359/341 |
| 6,219,176 B1 | 4/2001 | Terahara | 359/341 |
| 6,236,496 B1 | 5/2001 | Yamada et al. | 359/341 |
| 6,239,902 B1 | 5/2001 | Islam et al. | 359/334 |
| 6,239,903 B1 | 5/2001 | Islam et al. | 359/337 |
| 6,263,139 B1 | 7/2001 | Kawakami et al. | 385/123 |
| 6,310,716 B1 | 10/2001 | Evans et al. | 359/334 |
| 6,335,820 B1 | 1/2002 | Islam | 359/334 |
| 6,356,383 B1 | 3/2002 | Cornwell, Jr. et al. | 359/334 |
| 6,356,384 B1 | 3/2002 | Islam | 359/334 |
| 6,359,725 B1 | 3/2002 | Islam | 359/334 |
| 6,370,164 B1 | 4/2002 | Islam | 372/6 |
| 6,374,006 B1 | 4/2002 | Islam et al. | 385/15 |
| 6,381,391 B1 | 4/2002 | Islam et al. | 385/123 |
| 6,404,964 B1 | 6/2002 | Bhagavatula et al. | 385/123 |
| 6,414,786 B1 | 7/2002 | Foursa | 359/334 |
| 6,417,959 B1 | 7/2002 | Bolshtyansky et al. | 359/334 |
| 6,437,906 B1 | 8/2002 | Di Pasquale et al. | 359/337.2 |
| 6,532,330 B1 * | 3/2003 | Mollenauer | 385/123 |
| 2002/0001123 A1 | 1/2002 | Miyakawa et al. | 359/334 |

OTHER PUBLICATIONS

Vasilyev, et al., Pump intensity noise and ASE spectrum of Raman amplification in non–zero dispersion–shifted fibers, reprinted from the Optical Amplifiers and Their Applications Conference, 2001 Technical Digest, 2001 Optical Society of America, pp. 57–59.

Stolen et al., "Parametric Amplification and Frequency Conversion in Optical Fibers," IEEE Journal of Quantum Electronics, vol. QE–18, No. 7, pp. 1062–1072, Jul. 1982.

Agrawal, "Stimulated Raman Scattering," Ch. 8 and "Parametric Processes," Ch. 10 of Nonlinear Fiber Optics, 1989.

Inoue et al., "Wavelength Conversion Experiment Using Fiber Four–Wave Mixing," IEEE Photonics Technology Letters, vol. 4, No. 1, pp. 69–72, Jan. 1992.

Inoue, "Four–Wave Mixing in an Optical Fiber in the Zero–Dispersion Region," Journal of Lightwave Technology, vol. 10, No. 11, pp. 1553–1561, Nov. 1992.

Tatham et al., "20 nm Optical Wavelength Conversion Using Nondegenerative Four–Wave Mixing," IEEE Photonics Technology Letter, vol. 5, No. 11, pp. 1303–1305, Nov. 1993.

Inoue et al., "Polarisation insensitive wavelength conversion using a light injected DFB–LD with a loop configuration," Electronics Letters, vol. 30, No. 5, pp. 438–439, Mar. 1994.

Hansen et al.; "Repeaterless transmission experiment employing dispersion," 21st European Conference on Optical Communication, vol. 2, 1 page, Sep. 17–21, 1995.

Zou et al., "Compensation of Raman Scattering and EDFA's Nonuniform Gain in Ultra–Long Distance WDM Links," IEEE Photonics Technology Letters, vol. 8, No. 1, pp. 139–141, Jan. 1996.

Marhic et al., "Broadband fiber optical parametric amplifiers," Optics Letters, vol. 21, No. 8, pp. 573–575, Apr. 15, 1996.

Hedekvist et al., "Polarization Dependence and Efficiency in a Fiber Four–Wave Mixing Phase Conjugator with Orthogonal Pump Waves," IEEE Photonics Technology Letters, vol. 8, No. 6, pp. 776–778, Jun. 1996.

Yamada et al., "Broadband and gain–flattened amplifier composed of 1.55 $\mu$m–band $Er^{3+}$ doped fibre amplifier in a parallel configuration," Electronics Letters, vol. 33, No. 8, pp. 710–711, Apr. 10, 1997.

Masuda et al., "Ultra–wideband optical amplification with 3dB bandwidth of 65 nm using a gain–equalized two–stae erbium–doped fibre amplifier and Raman amplification," Electronics Letters, vol. 33, No. 9, pp. 73–78, Apr. 1997.

Masuda et al., "75–nm 3–dB Gain–band Optical Amplification with Erbium–doped fluoride Fibre amplifiers and Distributed Raman Amplifiers in 9 x 2.5–Gb/s WDM Transmission Experiment," ECOC Conference, vol. 5, No. 448, pp. 73–76, Sep. 22, 1997.

Wysocki et al., "Broad–Band Erbium–Doped Fiber Amplifier Flattened Beyond 40 nm Using Long–Period Grating Filter," IEEE Photonics Technology Letters, vol. 9, No. 10, pp. 1343–1345, Oct. 1997.

Sun et al., "80nm ultra–wideband erbium–doped silica fibre amplifier," vol. 33, No. 23, pp. 1965–1967, Nov. 6, 1997.

Hansen et al.; "Loss compensation in dispersion compensating fiber modules by Raman amplification," Optical Fiber Conference OFC'98, paper TuD1, Technical Digest, San Jose, CA, pp. 20–21, Feb. 1998.

Lee et al., "Bidirectional transmission of 40 Gbit/s WDM signal over 100km dispersion shifted fibre," Electronics Letters, vol. 34, No. 3, pp. 294–295, Feb. 5, 1998.

Okuno et al., "Generation of Ultra–Broad–Band Supercontinuum by Dispersion–Flattened and Decreasing Fiber," IEEE Photonics Technology Letters, vol. 10, No. 1, pp. 72–74, Jan. 1998.

Masuda et al., Wideband, gain–flattened, erbium–doped fibre amplifiers with 3dB bandwidths of >50nm.

Emori et al., "Less than 4.7 dB Noise Figure Broadband In–line EDFA with A Raman Amplified–1300 ps/nm DCF Pumped by Multi–channel WDM Laser Diodes," OSA Conference, paper PD3–1–5, Vail, CO, Jul. 1998.

Rotwitt et al., "Distributed Raman Amplifiers for Long Haul Transmission systems," LEOS, pp. 251–252.

Grubb et al., "Detailed analysis of Raman amplifiers for long–haul transmission," OFC Technical Digest, pp. 30–31.

Kawai et al., "Ultrawide, 75–nm 3–dB gain–band amplifier using erium–doped fluoride fiber and Raman fiber," OFC Technical Digest, pp. 32–34.

Becker et al., "Erbium Doped Fiber Amplifiers Fundamentals and Technology," Academic Press, pp. 55–60, 1999.

Yun et al., "Dynamic Erbium–Doped Fiber Amplifier Based on Active Gain Flattening with Fiber Acoustooptic Tunable Filters," IEEE Photonics Technology Letters, vol. 11, No. 10, pp. 1229–1231, Oct. 1999.

Mikkelsen et al., "160 Gb/s TDM Transmission Systems," ECOC, 4 pages, 2000.

Nielsen et al., "3.28 Tb/s (82x40 Gb/s) transmission over 3 x 100 km nonzero–dispersion fiber using dual C– and L–band hybrid Raman/Erbium–doped inline amplifiers," OFCC 2000, pp. 1229–1231, Mar. 7–10, 2000.

Ho et al., "Fiber optical parametric amplifier and wavelength converter with 208–nm gain bandwidth," Thursday Morning/CLEO, pp. 401–402, May 2000.

Yu et al., "All–Optical Wavelength Conversion of Short Pulses and NRZ Signals Based on a Nonlinear Optical Loop Mirror," Journal of Lightwave Technology, vol. 18, No. 7, pp. 1007–1017, Jul. 2000.

Seo et al., "Compensation of Raman–Induced Crosstalk Using a Lumped Germanosilicate Fiber Raman Amplifier in the 1.571–1.591–$\mu$m Region," IEEE Photonics Technology Letters, vol. 13, No. 1, pp. 28–30, Jan. 2001.

Pending Patent Application; U.S. patent application Ser. No. 09/811,067, entitled "Method and System for Reducing Degredation of Optical Signal to Noise Ratio", filed Mar. 16, 2001.

Pending Patent Application; U.S. patent application Ser. No. 09/811,103; entitled "System and Method for Wide Band Raman Amplification", filed Mar. 16, 2001.

Pending Patent Application; U.S. patent application Ser. No. 09/916,454; entitled "System and Method for Controlling Noise Figure", filed Jul. 27, 2001.

Pending Provisional Patent Application; U.S. patent application Ser. No. 60/310,147; entitled "Combined Laser Diode Raman Pumps; Active Gain Equalizers; Bi–Directional Ramam Amplifiers", filed May 2002.

Pending Patent Application, U.S. patent application Ser. No. 09/768,367, entitled "All Band Amplifier", filed Jan. 22, 2001.

Pending Patent Application; U.S. patent application Ser. No. 09/766,489; entitled "Nonlinear Polarization Amplifiers in Nonzero Dispersion Shifted Fiber", filed Jan. 19, 2001.

Pending Patent Application; U.S. patent application Ser. No. 09/694,858; entitled "Nonlinear Fiber Amplifiers used for a 1430–1530nm Low–Loss Window in Optical Fibers", filed Oct. 23, 2000.

Pending Patent Application; U.S. patent application Ser. No. 09/719,591; entitled "Fiber–Optic Compensation for Dispersion, Gain Tilt, and Band Pump Nonlinearity", filed Jun. 16, 1999.

Pending Patent Application; U.S. patent application Ser. No. 09/866,497; entitled "Nonlinear Fiber Amplifiers Used for A 1430–1530nm Low–Loss Window In Optical Fibers," (0173), filed May 25, 2001.

Pending Patent Application; U.S. patent application Ser. No. 10/003,199; entitled "Broadband Amplifier and Communication System", filed Oct. 30, 2001.

Pending Patent Application; U.S. patent application Ser. No. 10/007,643; entitled "Multi–Stage Optical Amplifier and Broadband Communication System", filed Oct. 30, 2001.

Pending Patent Application; U.S. patent application Ser. No. 10/005,472; entitled "Multi–Stage Optical Amplifier and Broadband Communication System", filed Nov. 6, 2001.

Pending Patent Application; U.S. patent application Ser. No. 10/014,839; entitled "Multi–Stage Optical Amplifier and Broadband Communication System", filed Dec. 10, 2001.

Pending Patent Application; U.S. patent application Ser. No. 09/990,142; entitled "BroadBand Amplifier and Communication System", filed Nov. 20, 2001.

Pending Patent Application; U.S. patent application Ser. No. 10/100,591; entitled "System and Method for Managing System Margin", filed Mar. 15, 2002.

Pending Patent Application; U.S. patent application Ser. No. 10/100,587, entitled "Fiber Optic Transmission System with Low Cost Transmitter Compensation", filed Mar. 15, 2002.

Pending Patent Application; U.S. patent application Ser. No. 10/116,487; entitled "Fiber Optic Transmission System for a Metropolitan Area Network", filed Apr. 3, 2002.

PCT International Search Report Form PCT/ISA/210, Sep. 6, 1999.

PCT International Search Report Form PCT/ISA/210, Jan. 11, 2000.

Nissov, M., et al., "Rayleigh Crosstalk in Long Cascades of Distributed Unsaturated Raman Amplifier", *Electronics Letters*, Jun. 10, 1999, vol. 35, No. 12, pp. 997–998.

Patent Abstracts of Japan, vol. 1997, No. 11, Nov. 28, 1997 & JP 09 197452 A (NEC Corp.), Jul. 31, 1997, abstract.

* cited by examiner

DISPERSION COMPENSATING NONLINEAR POLARIZATION AMPLIFIERS

CROSS REFERENCE TO RELATED APPLICATIONS

This application is a continuation-in-part of and claims the benefit of priority from the U.S. application Ser. No. 09/766,489, filed on January 19, 2001; and U.S. application Ser. No. 09/765,972, filed on Jan. 19, 2001 now U.S. Pat. No. 6,600,592. This application also claims priority and is a continuation from U.S. application Ser. No. 09/760,201, filed Jan. 12, 2001 which is a division and claims the benefit of priority from U.S. application Ser. No. 09/558,300, filed Apr. 25, 2000, now U.S. Pat. No. 6,239,903 which is a divisional of U.S. application Ser. No. 09/046,900, filed Mar. 24, 1998 now U.S. Pat. No. 6,101,024. All the above applications are fully incorporated herein by reference.

BACKGROUND

1. Field of the Invention

The present invention relates generally to optical amplifiers used in fiber-optics for telecommunications, cable television and other fiber-optics applications, and more particularly to an optical fiber amplifier and method for producing an amplified broadband output from an optical signal with dispersion compensation.

2. Description of the Related Art

Because of the increase in data intensive applications, the demand for bandwidth in communications has been growing tremendously. In response, the installed capacity of telecommunication systems has been increasing by an order of magnitude every three to four years since the mid 1970s. Much of this capacity increase has been supplied by optical fibers that provide a four-order-of-magnitude bandwidth enhancement over twisted-pair copper wires.

To exploit the bandwidth of optical fibers, two key technologies have been developed and used in the telecommunication industry: optical amplifiers and wavelength-division multiplexing (WDM). Optical amplifiers boost the signal strength and compensate for inherent fiber loss and other splitting and insertion losses. WDM enables different wavelengths of light to carry different signals parallel over the same optical fiber. Although WDM is critical in that it allows utilization of a major fraction of the fiber bandwidth, it would not be cost-effective without optical amplifiers. In particular, a broadband optical amplifier that permits simultaneous amplification of many WDM channels is a key enabler for utilizing the full fiber bandwidth.

Silica-based optical fiber has its lowest loss window around 1550 nm with approximately 25 THz of bandwidth between 1430 and 1620 nm. For example, FIG. 1 illustrates the loss profile of a 50 km optical fiber. In this wavelength region, erbium-doped fiber amplifiers (EDFAs) are widely used. However, as indicated in FIG. 2, the absorption band of a EDFA nearly overlaps its the emission band. For wavelengths shorter than about 1525 nm, erbium-atoms in typical glasses will absorb more than amplify. To broaden the gain spectra of EDFAs, various dopings have been added. For example, as shown in FIG. 3a, codoping of the silica core with aluminum or phosphorus broadens the emission spectrum considerably. Nevertheless, as depicted in FIG. 3b, the absorption peak for the various glasses is still around 1530 nm.

Hence, broadening the bandwidth of EDFAs to accommodate a larger number of WDM channels has become a subject of intense research. As an example of the state-of-the-art, a two-band architecture for an ultra-wideband EDFA with a record optical bandwidth of 80 nm has been demonstrated. To obtain a low noise figure and high output power, the two bands share a common first gain section and have distinct second gain sections. The 80 nm bandwidth comes from one amplifier (so-called conventional band or C-band) from 1525.6 to 1562.5 nm and another amplifier (so-called long band or L-band) from 1569.4 to 1612.8 nm. As other examples, a 54 nm gain bandwidth achieved with two EDFAs in a parallel configuration, i.e., one optimized for 1530–1560 nm and the other optimized for 1576–1600 nm, and a 52 nm EDFA that used two-stage EDFAs with an intermediate equalizer have been demonstrated.

These recent developments illustrate several points in the search for broader bandwidth amplifiers for the low-loss window in optical fibers. First, bandwidth in excess of 40–50 nm require the use of parallel combination of amplifiers even with EDFAs. Second, the 80 nm bandwidth may be very close to the theoretical maximum. The short wavelength side at about 1525 nm is limited by the inherent absorption in erbium, and long wavelength side is limited by bend-induced losses in standard fibers at above 1620 nm. Therefore, even with these recent advances, half of the bandwidth of the low-loss window, i.e., 1430–1530 nm, remains without an optical amplifier.

There is a need for nonlinear polarization amplifiers that provide a low noise figure amplification for operation near the zero dispersion wavelength of fibers. There is a further need for a broadband fiber transmission system that includes nonlinear polarization amplifiers which provide low noise amplification near the zero dispersion wavelength of fibers.

SUMMARY OF THE INVENTION

Accordingly, an object of the present invention is to provide a broadband nonlinear polarization amplifier.

Another object of the present invention is to provide a broadband nonlinear polarization amplifier with a distributed gain medium.

A further object of the present invention is to provide a broadband nonlinear polarization amplifier that has a distributed gain medium with a magnitude of dispersion that is less than 50 ps/nm-km.

Yet another object of the present invention is to provide a broadband nonlinear polarization amplifier with a transmission line that includes a Raman amplifier, and at least a portion of the transmission line with a magnitude of dispersion less than 50 ps/nm-km.

Another object of the present invention is to provide an amplifier module that includes a dispersion compensating fiber with a negative sign of dispersion and an absolute magnitude of dispersion of at least 50 ps/nm-km.

A further object of the present invention is to provide an amplifier module that has a transmission fiber and a dispersion compensating fiber, where a difference between the relative dispersion slopes of the transmission fiber and the dispersion compensating fiber is no greater than 0.0032/nm over at least a portion of a signal wavelength range.

Yet another object of the present invention is to provide an amplifier module that includes a dispersion compensating fiber a pump source that produces a depolarized pump beam.

Still a further object of the present invention is to provide an optical fiber communication system that includes a dispersion compensating fiber with at least a portion having a negative sign of dispersion and an absolute magnitude of dispersion of at least 50 ps/nm-km.

These and other objects of the present invention are achieved in a broadband nonlinear polarization amplifier with an input port for inputting an optical signal having a wavelength $\lambda$. A distributed gain medium receives and amplifiers the optical signal through nonlinear polarization. The distributed gain medium has zero-dispersion at wavelength $\lambda_0$. A magnitude of dispersion at $\lambda$ is less than 50 ps/nm-km. One or more semiconductor lasers are operated at wavelengths $\lambda_p$ for generating a pump light to pump the distributed gain medium. An output port outputs the amplified optical signal.

In another embodiment of the present invention, a broadband fiber transmission system includes a transmission line having at least one zero dispersion wavelength $\lambda_o$ and transmitting an optical signal of $\lambda$. The transmission line includes a Raman amplifier that amplifies the optical signal through Raman gain. At least a portion of the transmission line has a magnitude of dispersion at $\lambda$ less than 50 ps/nm-km. One or more semiconductor lasers are operated at wavelengths $\lambda_p$ and can generate a pump light to pump the Raman amplifier. $\lambda$ is close to $\lambda_0$ and $\lambda_0$ is less than 1540 nm or greater than 1560 nm.

In another embodiment of the present invention, a broadband fiber transmission system includes a transmission line having at least one zero dispersion wavelength $\lambda_o$, and transmitting an optical signal of $\lambda$. The transmission line includes a Raman amplifier and a discrete optical amplifier that amplify the optical signal. At least a portion of transmission line has a magnitude of dispersion at $\lambda$ less than 50 ps/nm-km. One or more semiconductor lasers are operated at wavelengths $\lambda_p$ and can generate a pump light to pump the amplifiers. $\lambda$ is close to $\lambda_0$ and $\lambda_0$ is less than 1540 nm or greater than 1560 nm In another embodiment of the present invention, an amplifier module includes a transmission fiber configured to transmit a signal. A dispersion compensating fiber has at least a portion with a negative sign of dispersion and an absolute magnitude of dispersion of at least 50 ps/nm-km. A first intermediate fiber couples the dispersion compensating fiber with the transmission fiber. The first intermediate fiber has a mode field diameter that is less than a mode field diameter of the transmission fiber and greater than a mode field diameter of the dispersion compensating fiber. At least a first pump source is coupled to the transmission fiber. The first pump source produces a first pump beam that creates Raman gain in the dispersion compensating fiber.

In another embodiment of the present invention, an amplifier module includes a transmission fiber has a relative dispersion slope and is configured to transmit a signal. A dispersion compensating fiber has a relative dispersion slope and is coupled to the transmission fiber. A difference between the relative dispersion slopes of the transmission fiber and the dispersion compensating fiber is no greater than 0.0032/nm over at least a portion of a signal wavelength range. At least a first pump source is coupled to the transmission fiber and produces a first pump beam that creates Raman gain in the dispersion compensating fiber.

In another embodiment of the present invention, an amplifier module includes a transmission fiber configured to transmit a signal. A dispersion compensating fiber is coupled to the transmission fiber. At least a first pump source is coupled to the transmission fiber. The first pump source produces a depolarized first pump beam that creates Raman gain in the dispersion compensating fiber.

In another embodiment of the present invention, an optical fiber communication system includes a transmitter, a receiver and a transmission fiber coupled to the transmitter and the receiver. The transmission fiber exhibits chromatic dispersion at a system wavelength. A dispersion compensating fiber is also included. At least a portion of the dispersion compensating fiber has a negative sign of dispersion and an absolute magnitude of dispersion of at least 50 ps/nm-km. A first intermediate fiber couples the dispersion compensating fiber with the transmission fiber. The first intermediate fiber has a mode field diameter that is less than a mode field diameter of the transmission fiber and greater than a mode field diameter of the dispersion compensating fiber. At least a first pump source is coupled to the transmission fiber and produces a first pump beam that creates Raman gain in the dispersion compensating fiber.

BRIEF DESCRIPTION OF THE DRAWINGS

These and other objects, features and elements of the present invention will be better understood from the following detailed description of preferred embodiments of the invention in which.

DETAILED DESCRIPTION OF PREFERRED EMBODIMENTS

Some embodiments provide a structure for exploiting almost the full 25 THz of bandwidth available in the low-loss window of optical fibers from 1430 nm to 1620 nm. The broadband NLPA amplifier of some embodiments combines Raman amplification with either PA or 4WM to achieve bandwidth performance improvements that neither technology by itself has heretofore been able to deliver.

The broadband NLPA of other embodiments comprise an input port for inputting an optical signal having a wavelength $\lambda$, a distributed gain medium for receiving the optical signal and amplifying and spectrally broadening the same therein through nonlinear polarization, a pump source operated at wavelength $\lambda_p$ for generating a pumping light to pump the distributed gain medium, and an output port for outputting the amplified and spectrally broadened optical signal. The distributed gain medium can have zero-dispersion at wavelength $\lambda_0$ such that $\lambda \geq \lambda_0 \geq \lambda_p$. The pumping light can cascade through the distributed gain medium a plurality of Raman orders including an intermediate order having a wavelength $\lambda_r$ at a close proximity to the zero-dispersion wavelength $\lambda_0$ to phase match four-wave mixing (if $\lambda_r < \lambda_0$) or parametric amplification (if $\lambda_r > \lambda_0$).

A first embodiment of the NLPA uses open-loop amplification with an optical fiber gain medium. A pump source operated at 1240 mn can be used. The pump may be retro-reflected to increase the conversion efficiency. A second embodiment of the NLPA can use a Sagnac Raman cavity that is pumped at 1240 nm. Feedback in the Sagnac Raman cavity can reduce the required pump power, and the broadband cavity design supports much of the generated bandwidth. Another embodiment of the NLPA can use a Sagnac Raman cavity pumped at 1117 nm for a very broadband operation.

Other embodiments relate to a parallel optical amplification apparatus having a combination of optical amplifiers. In one embodiment, the parallel optical amplification apparatus comprises two parallel stages of NLPAs with one NLPA optimized for 1430 to 1480 nm and the other for 1480 to 1530 nm. In another embodiment, the full 25 THz of the low-loss window in optical fibers can be exploited by a parallel combination of a Raman amplifier and a rare earth doped amplifier. In one embodiment, an NLPA can cover the low-loss window of approximately 1430 nm to 1530 nm, and an EDFA can cover the low-loss window of approximately 1530 nm to 1620 nm.

Stimulated Raman scattering effect, PA and 4WM can be result of third-order nonlinearities that occur when a dielectric material such as an optical fiber is exposed to intense light. The third-order nonlinear effect can be proportional to the instantaneous light intensity.

Figure 1:
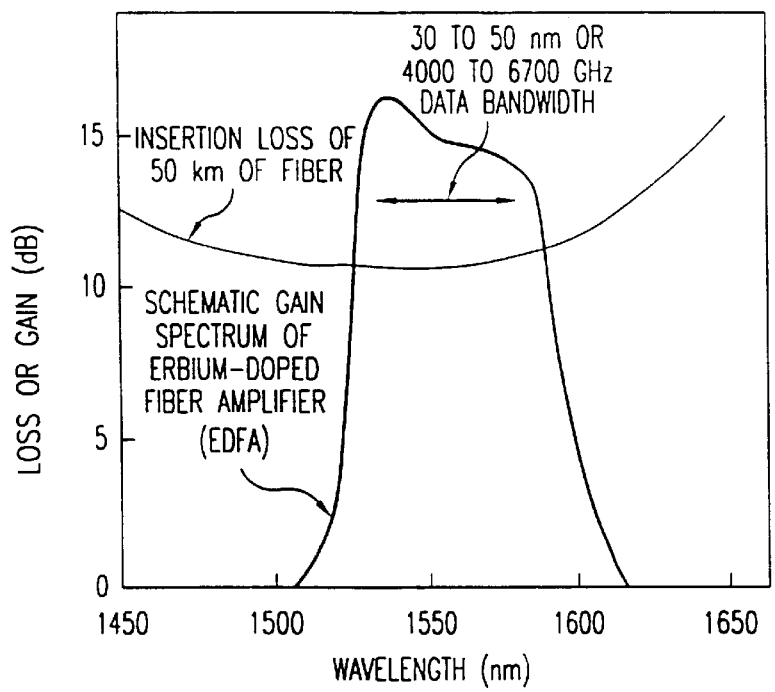
FIG. 1 depicts the loss profile of a 50 km fiber and the gain band of a typical EDFA.
Figure 2:
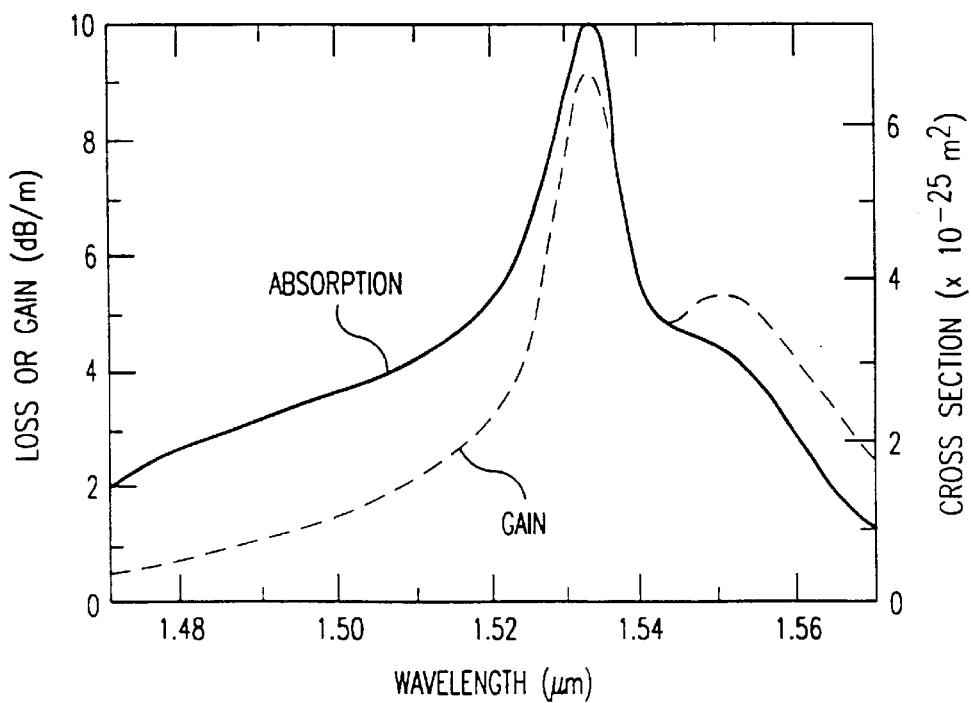
FIG. 2 depicts absorption and gain spectra of an EDFA.
Figure 3A:
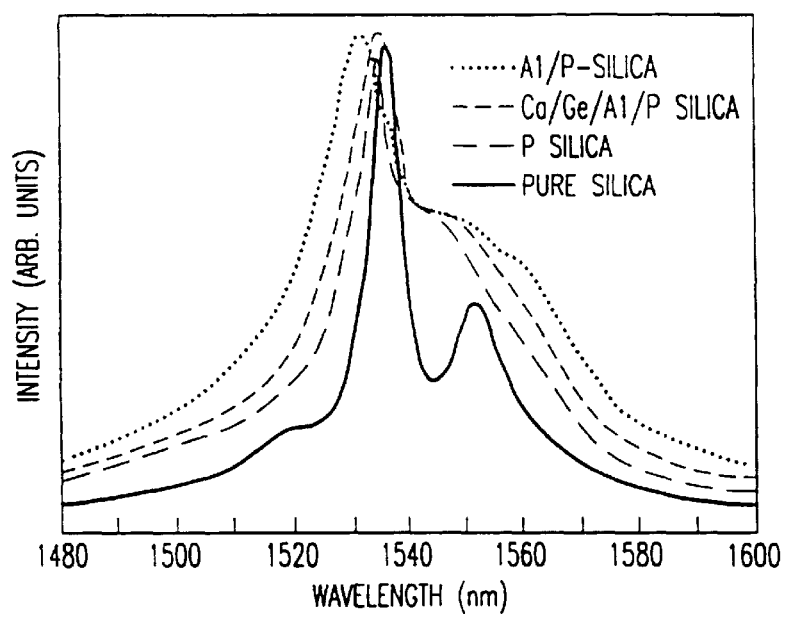
FIG. 3a depicts emission spectra of four EDFAs with different core compositions.
Figure 3B:
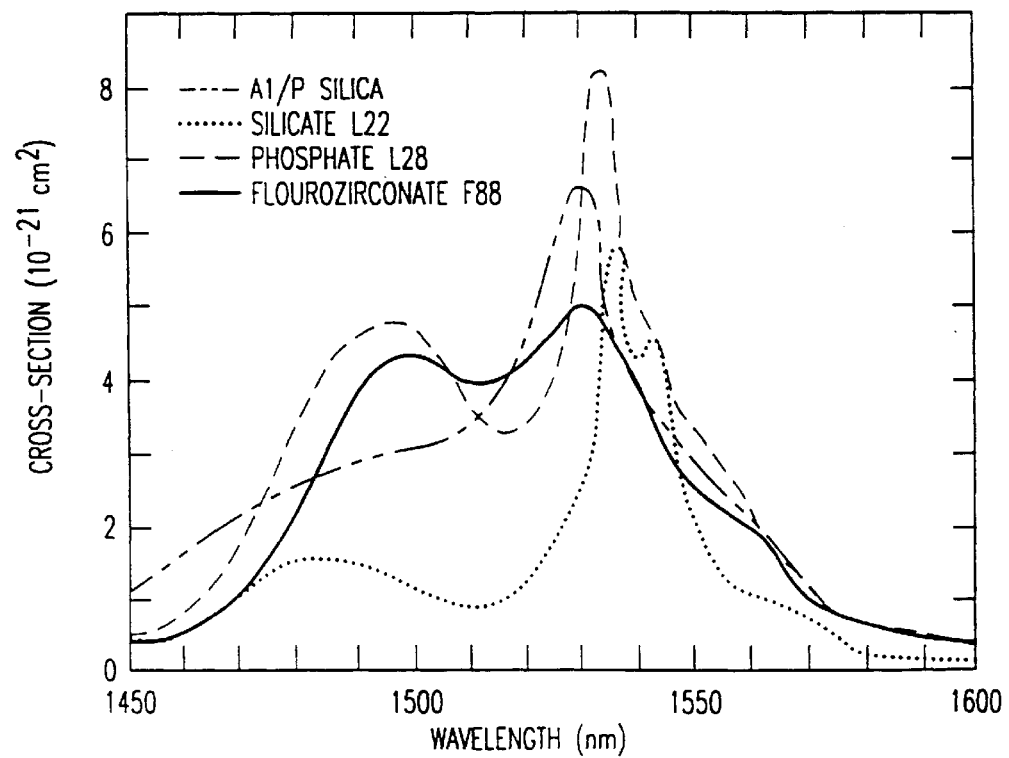
FIG. 3b depicts absorption cross-section of erbium-doped glass of different compositions.
Figure 4:
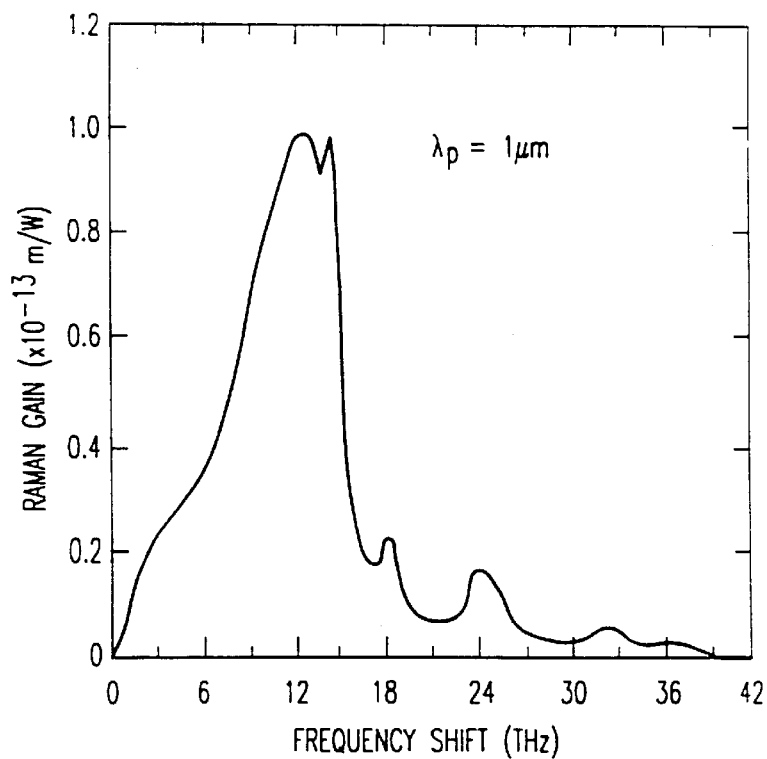
FIG. 4 depicts a measured Raman-gain spectrum for fused silica at a pump wavelength of 1000 nm.

Stimulated Raman scattering can be an important nonlinear process that turns optical fibers into amplifiers and tunable lasers. Raman gain can result from the interaction of intense light with optical phonons in silica fibers, and Raman effect leads to a transfer of energy from one optical beam (the pump) to another optical beam (the signal). The signal can be downshifted in frequency (or upshifted in wavelength) by an amount determined by vibrational modes of silica fibers. The Raman gain coefficient $g_r$ for the silica fibers is shown in FIG. 4. Notably, the Raman gain $g_r$ can extend over a large frequency range (up to 40 THz) with a broad peak centered at 13.2 THz (corresponding to a wavelength of 440 cm$^{-1}$). This behavior over the large frequency range can be due to the amorphous nature of the silica glass and enable the Raman effect to be used in broadband amplifiers. The Raman gain can depend on the composition of the fiber core and can vary with different dopant concentrations.

Raman amplification has some attractive features. First, Raman gain can upgrade existing fiber optic links because it is based on the interaction of pump light with optical phonons in the existing fibers. Second, in some embodiments there is no excessive loss in the absence of pump power—an important consideration for system reliability.

Raman cascading is the mechanism by which optical energy at the pump wavelength is transferred, through a series of nonlinear polarizations, to an optical signal at a longer wavelength. Each nonlinear polarization of the dielectric can produce a molecular vibrational state corresponding to a wavelength that is offset from the wavelength of the light that produced the stimulation. The nonlinear polarization effect can be distributed throughout the dielectric, resulting in a cascading series of wavelength shifts as energy at one wavelength excites a vibrational mode that produces light at a longer wavelength. This process can cascade through numerous orders. Because the Raman gain profile can have a peak centered at 13.2 THz in silica fibers, one Raman order can be arranged to be separated from the previous order by 13.2 THz.

Cascading makes stimulated Raman scattering amplifiers very desirable. Raman amplification can be used to amplify multiple wavelengths (as in wavelength division multiplexing) or short optical pulses because the gain spectrum can be very broad (a bandwidth of greater than 5 THz around the peak at 13.2 THz). Cascading can enable Raman amplification over a wide range of different wavelengths. By varying the pump wavelength or by using cascaded orders of Raman gain, the gain can be provided over the entire telecommunications window between 1300 nm and 1600 nm.

Parametric amplification and 4 wave mixing (PA/4WM) involve two pump (P) photons that create Stokes (S) and anti-Stokes (A) photons. Both PA/4WM and Raman amplification arise from the third order susceptibility $\chi^{(3)}$ in optical fibers. More specifically, the real part of $\chi^{(3)}$, the so-called nonlinear index of refraction $n_2$, is responsible for PA/4WM, while the imaginary part of $\chi^{(3)}$ associated with molecular vibrations corresponds to the Raman gain effect. In silica fibers of some embodiments, about ⅘ths of the $n_2$ is an electronic, instantaneous nonlinearity caused by ultraviolet resonances, while about ⅕th of $n_2$ arises from Raman-active vibrations, e.g., optical phonons. The imaginary part of this latter contribution corresponds to the Raman gain spectrum of FIG. 4.

Whereas Raman amplification is attractive for providing optical gain, PA/4WM can offer an efficient method to broaden the bandwidth of the optical gain. PA/4WM can have a much smaller frequency separation between pump and signal than Raman amplification, and the frequency difference may depend on the pump intensity. As in Raman amplification, one advantage of PA/4WM gain is that it can be present in every fiber. However, unlike the Raman effect, both PA and 4WM can require phase-matching. 4WM can be inefficient in long fibers due to the requirement for phase-matching. However, PA can act as self-phase-matched because the nonlinear index of refraction is used to phase match the pump and sidebands. This can be true in embodiments operating near the zero-dispersion wavelength in fibers. When 4WM and PA occur near the zero-dispersion wavelength of a single-mode fiber, phase-matching can become automatic in the fiber. In 4WM, sidebands can be generated without gain when the pump wavelength falls in the normal dispersion regime (where the pumping wavelength is shorter than the zero-dispersion wavelength). PA is 4-photon amplification in which the nonlinear index of refraction is used to phase match the pump and sidebands. For PA the pump wavelength can lie in the anomalous group velocity regime (i.e., where the pumping wavelength is longer than the zero-dispersion wavelength) and proper phase matching can require that pump and signal be co-propagating in some embodiments.

To illustrate the PA/4WM gain, the gain coefficient can be derived as:

$$g = \sqrt{(\gamma P)^2 - \left[\left(\frac{\Delta \kappa}{2}\right) + \gamma P\right]^2} \quad 1$$

The first term under the square root sign corresponds to the third order nonlinearity that couples the pump photons to the sidebands. The second term corresponds to the phase mismatch between the waves and it consists of two parts: one due to the wave-vector mismatch at the different wavelengths and the other due to the increase in nonlinear index induced by the pump. The nonlinearity parameter can be defined as $$\gamma = \frac{\omega}{c}\frac{n_2}{A_{\it eff}} = \frac{2\pi}{\lambda}\frac{n_2}{A_{\it eff}} \quad 2$$

Some embodiments operate near the zero-dispersion wavelength $\lambda_0$, and the propagation constant can be expanded as:

$$\Delta \kappa = \frac{\lambda^2}{2\pi c}\left[\frac{dD}{d\lambda}\bigg|_{\lambda_0}(\lambda_p - \lambda_0)\right]\Omega^2 \quad 3$$

where $$\Omega = \omega_p - \omega_s = \omega_a - \omega_p. \quad 4$$

Figure 5:
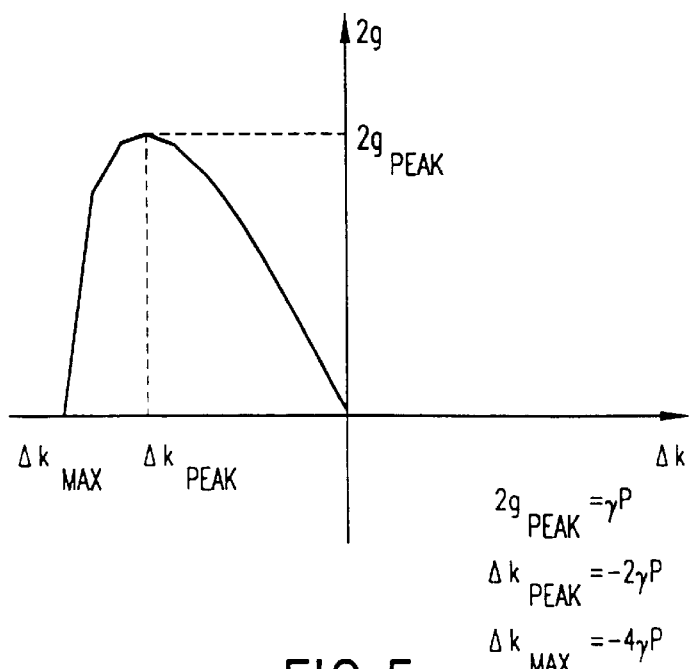
FIG. 5 plots power gain coefficient 2 g versus phase vector mismatch $\Delta k$ for parametric amplification.

The pump wavelength can falls in the normal dispersion regime for some embodiments, and D<0,∂D/∂λ>0, ($\lambda_p$−$\lambda_0$) <0, so that Δk>0. In this case, g can be imaginary, and there may be no gain during the sideband generation process. This can correspond to the case of 4WM. Some embodiments operate in the anomalous group velocity dispersion regime, and D>0,∂D/∂λ>0, ($\lambda_p$−$\lambda_0$)>0, so that Δk<0. This can be the regime of PA, and the nonlinearity helps to reduce the phase mismatch (i.e., the two parts in the second term in Equation (1) are of opposite sign). There can be gain for PA, and the gain can be tunable with the pump power. For example, the power gain coefficient 2 g is plotted schematically in FIG. 5 for operation in the anomalous group velocity regime. The peak gain ($g_{peak}$=γP) can occur at $\Delta k_{peak}$=−2γP. The range over which the gain exists can be given by 0>Δk>−4γP in some embodiments. Thus, the peak gain can be proportional to the pump power, and the Δk range can be determined by the pump power.

Consequently, from Equation (2) the bandwidth can be increased by increasing the pump power, increasing the nonlinear coefficient $n_2$ or decreasing the effective area $A_{\it eff}$. In other embodiments, for a given required frequency range over which gain is required, the pump requirements can be reduced by increasing the effective nonlinearity ($n_2/A_{\it eff}$).

Several embodiments lead to broadband gain for cascaded Raman amplification by arranging at least one intermediate Raman cascade order at close proximity to the zero-dispersion wavelength $\lambda_0$ (e.g., within ±5 nm of $\lambda_0$ for some embodiments; within ±2 nm for other embodiments). Either 4WM (if $\lambda_r$<$\lambda_0$) or PA (if $\lambda_r$>$\lambda_0$) can lead to spectral broadening of that particular Raman order. In subsequent Raman orders the bandwidth can grow even further. In other embodiments, the cascade Raman wavelength $\lambda_r$ lies to the long wavelength side of $\lambda_0$ (i.e., in the anomalous dispersion regime), so that parametric amplification can occur.

Figure 6:
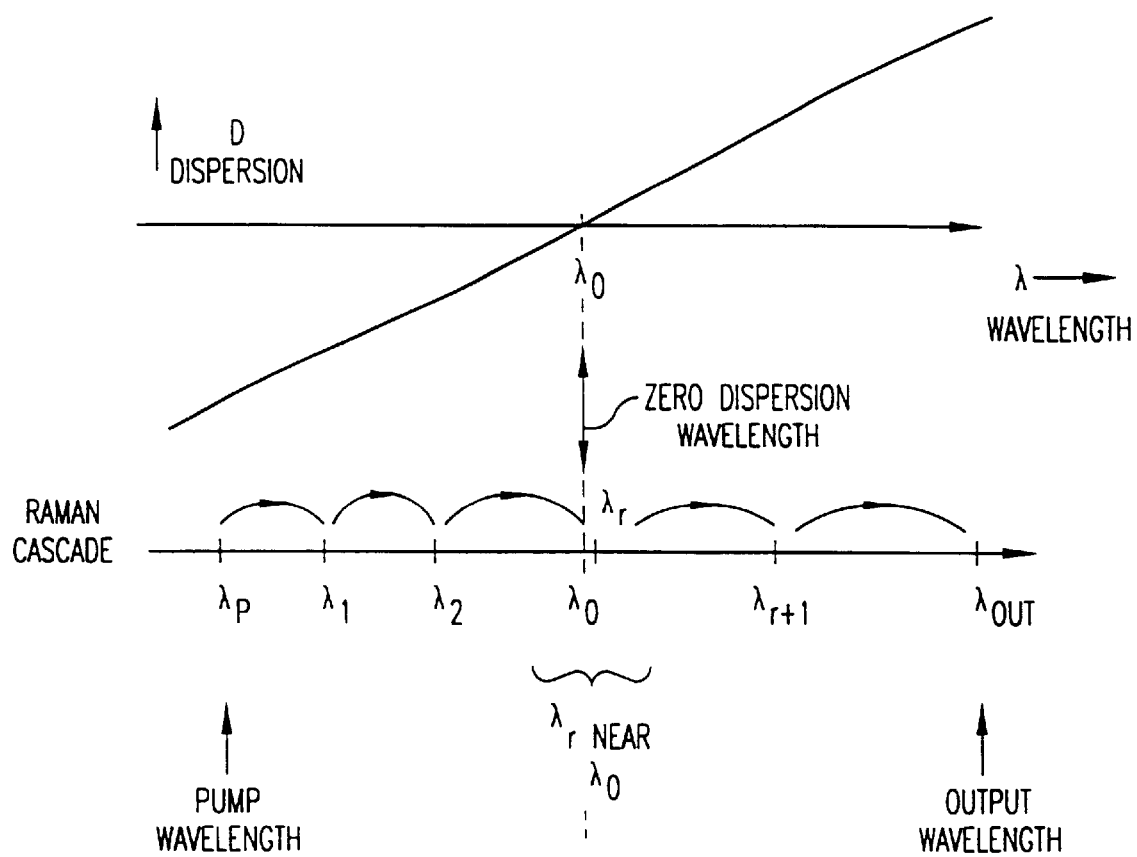
FIG. 6 demonstrates basic concepts of the NLPA of the invention.

An embodiment of the broadband NLPA is illustrated in FIG. 6. Starting from the pump wavelength $\lambda_p$, cascaded Raman amplification can be used in the first few stages. The pump can be more than one Raman shift or 13.2 THz away from the zero-dispersion wavelength. To keep higher efficiency in these initial steps, some embodiments can use a narrow band cavity design, such as designs based on gratings or wavelength selective couplers.

Some embodiments broaden the gain bandwidth by positioning one of the intermediate Raman cascade orders at a close proximity to the zero-dispersion wavelength $\lambda_0$. By operating close to $\lambda_0$, it can almost automatically phase-match either 4WM or PA. In the subsequent cascaded Raman orders, the gain bandwidth may continue to broaden. This occurs because the effective gain bandwidth of Raman is the convolution of the bandwidth of the pump (in this case, the previous Raman cascade order) with the Raman gain curve. In some embodiments with Raman amplification, the gain spectrum follows the pump spectrum. As the pump wavelength changes, the Raman gain can change as well, separated by the distance of optical phonon energy which in silica fibers is an approximately 13.2 THz down-shift in frequency.

If the fiber is conventional so-called standard fiber, then zero-dispersion wavelength $\lambda_0$ can be about 1310 nm. For dispersion-shifted fiber, the zero-dispersion wavelength $\lambda_0$ can shift to longer wavelengths by adding waveguide dispersion. In other embodiments, a dispersion-flattened fiber can be used for low dispersion values over one or more of the Raman cascade orders. In some embodiments with dispersion-flattened fiber, the dispersion slope can be small, so the gain bandwidth can be even larger (c.f. Equations (1) and (3)).

The Raman gain spectrum can follow the pump spectrum, such as when there is nothing in the Raman cavity to restrict the bandwidth of the subsequent orders. For these higher cascade order Raman laser schemes, some embodiments use gratings or wavelength selective couplers. Other embodiments with the broadband cavity design of the Sagnac Raman amplifier and laser can have increased bandwidth with a tailored pump spectrum. A single-pass fiber design can constitute the broadest bandwidth design. A broadband cavity such as the Sagnac Raman cavity can have the feedback used to lower the threshold and the required pump power. Broadening the bandwidth can lead to a drop in efficiency, so the pump powers can be higher for the broadband cavity designs.

Cascaded Raman amplification can reach the 1430–1530 nm range of the low-loss window. Pumping can occur with a commercially available cladding-pumped fiber laser, which operates around 1060 to 1140 nm. The various Raman orders, each separated by 13.2 Thz from the previous order, are set forth in Table 1.

Table 1. Various Raman orders when pumping between 1060 and 1140 nm (separation of 13.2 THz between orders)

TABLE 1

Various Raman orders when pumping between 1060 and 1140 nm
(separation of 13.2 THz between orders)

| Wavelength (nm) | Δλ | Wavelength (nm) | Δλ |
|---|---|---|---|
| 1060.00 | 51.86 | 1110.00 | 57.00 |
| 1111.86 | 57.19 | 1167.00 | 63.17 |
| 1169.05 | 63.39 | 1230.16 | 70.40 |
| 1232.44 | 70.66 | 1300.56 | 78.94 |
| 1303.11 | 79.26 | 1379.50 | 89.14 |
| 1382.37 | 89.53 | 1468.64 | 101.46 |
| 1471.90 | 101.93 | 1570.10 | 116.52 |
| 1573.82 | 117.09 | 1686.62 | 135.20 |
| 1070.00 | 52.86 | 1117.00 | 57.74 |
| 1122.86 | 58.36 | 1174.74 | 64.03 |
| 1181.22 | 64.76 | 1238.77 | 71.41 |
| 1245.98 | 72.27 | 1310.18 | 80.15 |
| 1318.25 | 81.17 | 1390.33 | 90.59 |
| 1399.42 | 91.82 | 1480.92 | 103.22 |
| 1491.25 | 104.72 | 1584.15 | 118.69 |
| 1595.97 | 120.54 | 1702.84 | 137.92 |
| 1080.00 | 53.88 | 1120.00 | 58.05 |
| 1133.88 | 59.54 | 1178.05 | 64.40 |
| 1193.42 | 66.14 | 1242.46 | 71.85 |
| 1259.56 | 73.90 | 1314.31 | 80.67 |
| 1333.47 | 83.11 | 1394.98 | 91.22 |
| 1416.58 | 94.16 | 1486.20 | 103.99 |
| 1510.74 | 107.57 | 1590.19 | 119.63 |
| 1618.32 | 124.07 | 1709.82 | 139.10 |
| 1090.00 | 54.91 | 1130.00 | 59.12 |
| 1144.91 | 60.74 | 1189.12 | 65.65 |
| 1205.65 | 67.54 | 1254.77 | 73.32 |
| 1273.19 | 75.56 | 1328.10 | 82.43 |
| 1348.74 | 85.09 | 1410.53 | 93.33 |
| 1433.83 | 96.55 | 1503.86 | 106.56 |
| 1530.38 | 110.49 | 1610.42 | 122.81 |
| 1640.87 | 127.69 | 1733.24 | 143.09 |
| 1100.00 | 55.95 | 1140.00 | 60.20 |
| 1155.95 | 61.94 | 1200.20 | 66.92 |
| 1217.89 | 68.96 | 1267.12 | 74.82 |
| 1286.85 | 77.24 | 1341.93 | 84.21 |
| 1364.09 | 87.10 | 1426.14 | 95.48 |
| 1451.19 | 98.98 | 1521.62 | 109.18 |
| 1550.17 | 113.47 | 1630.81 | 126.07 |
| 1663.64 | 131.40 | 1756.87 | 147.19 |

To obtain gain between 1430 nm and 1520 nm, the pump can be operated between 1090 nm and 1140 nm, and five cascaded Raman orders can be used to reach the desired wavelength. To make use of the broadening from PA or 4WM, a pumping scheme can be selected in the middle of this range, i.e., starting with a pump wavelength of 1117 nm. Then, the various Raman orders land at approximately 1175 nm, 1240 nm, 1310 nm, 1390 nm and finally 1480 nm. In particular, the third Raman frequency (1310 nm) passes through the zero-dispersion point of a standard fiber, and the next order (1390 nm) can be close if the fiber is dispersion shifted. A broadband gain can be expected for wavelengths in the 1430–1530 nm range centered around 1480 nm by using a fiber with a standard dispersion and a pump wavelength of 1117 nm, 1175 mn or 1240 nm.

Figure 7:
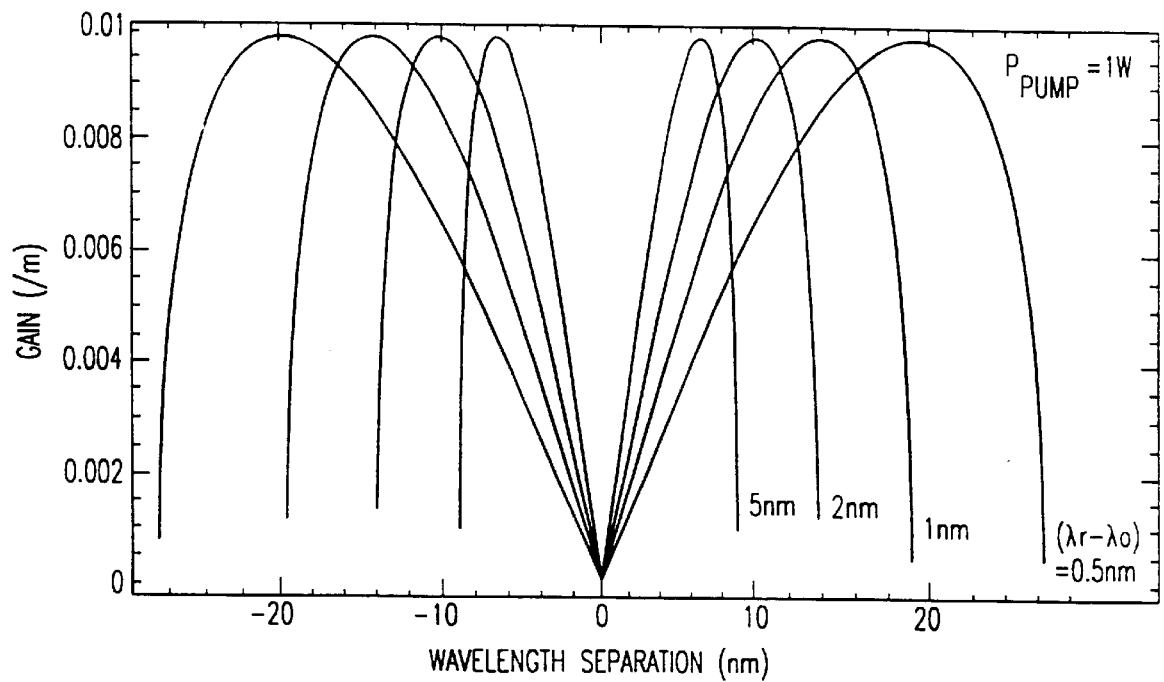
FIG. 7 illustrates the spectral broadening and gain expected from PA for a pump power of 1W and different separations between the pump and zero-dispersion wavelength.
Figure 8:
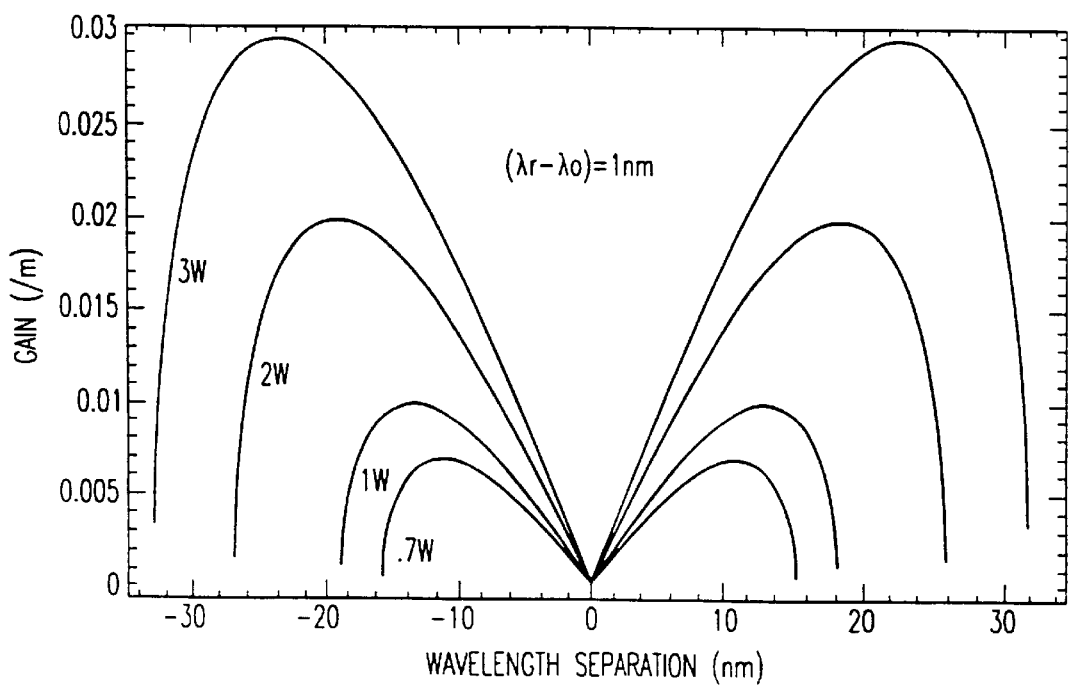
FIG. 8 illustrates the spectral broadening and gain expected from PA for a pump and zero-dispersion wavelength separation of 1 nm and for varying pump powers.

Broadening can be expected from PA. A standard fiber can be used and the pump wavelength can start at 1117 nm. The calculations use Equations (1–4) with the following typical parameters for high-Raman cross-section fiber in some embodiments: $\lambda_0$=1310 nm, $\gamma$=9.9W$^{-1}$km$^{-1}$, and a dispersion slope of 0.05 ps/nm-km. In FIG. 7, the gain coefficient for PA is plotted versus wavelength at a pump power of 1W and wavelength separations ($\lambda_r$-$\lambda_0$) of 0.5, 1, 2 and 5 nm. For a wavelength separation of 2 nm, the PA peak gain occurs at ±10 nm, so the spectral broadening is over 20 nm. The closer the pump wavelength approaches the zero-dispersion wavelength, the wider the gain bandwidth can be. In addition, FIG. 8 plots the gain versus wavelength for a separation of ($\lambda_r$-$\lambda_0$)=1 nm and pump powers of 0.7, 1, 2, and 3W. The peak gain can increase directly proportionally to the pump power, while the bandwidth can increase as the square root of pump power.

Figure 9:
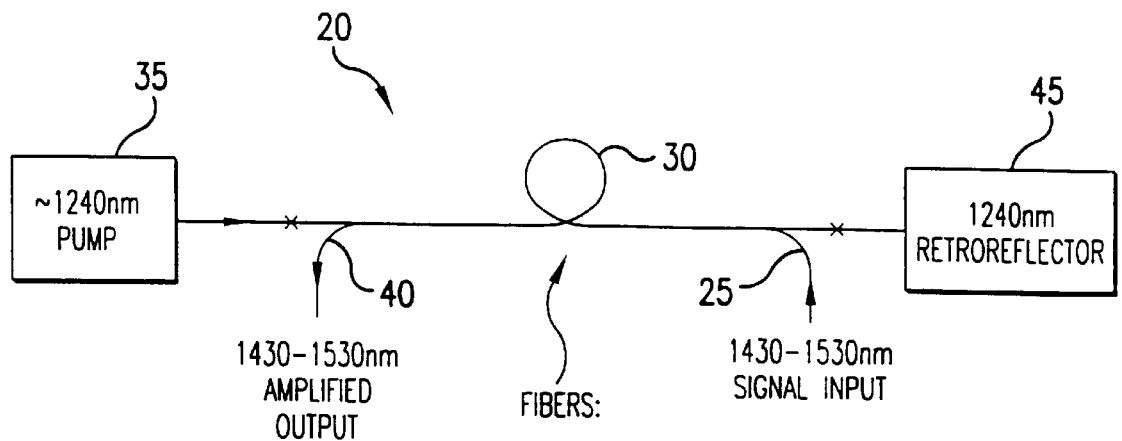
FIGS. 9, 9a, 9b and 9c are cross-sectional views illustrating the process of fabricating a thin film transistor according to another embodiment of the present invention.
Figure 9A:
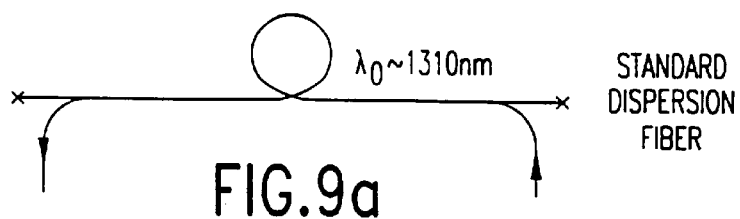
Figure 9B:
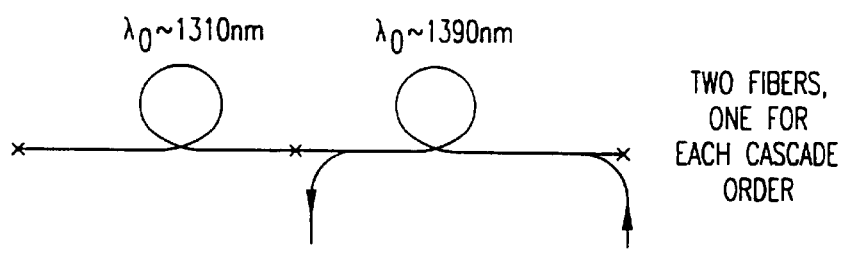
Figure 9C:
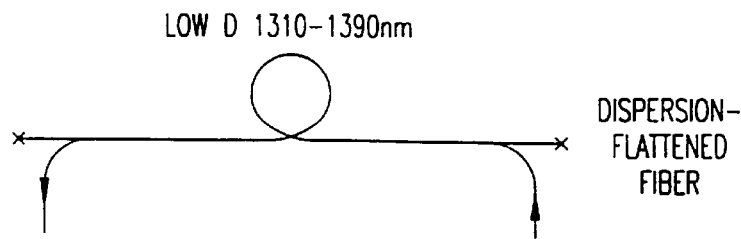

FIG. 9 shows a first embodiment that uses an open-loop design to produce an amplified broadband signal for a range of wavelengths between 1430 nm and 1530 nm. The open-loop design is a nonlinear polarization amplifier, and may have a high pump power requirement. In the NLPA amplifier 20 as illustrated in FIG. 9, an optical signal having a wavelength between 1430 nm and 1530 nm is input from an input port 25 to an optical fiber 30. The optical fiber 30 is pumped by a pumping light generated by a pumping laser 35 operated at a wavelength of about 1240 nm. The optical signal is amplified and spectrally broadened in the fiber by nonlinear polarization, and output through an output port 40. The configuration is so arranged that the optical signal can have a wavelength greater than the zero-dispersion wavelength of the fiber, which in turn is greater than the pumping wavelength of 1240 nm.

In this open-loop configuration, the fiber can have a cut-off wavelength below 1240 nm to be single-mode (spatial) over all wavelengths of the Raman cascade. Three choices of the fiber embodiments can be used in some embodiments. First, a standard dispersion fiber with a zero-dispersion wavelength at about 1310 nm. Second, two fibers spliced together with one fiber having a zero-dispersion wavelength at about 1310 nm (first cascade) and the other at 1390 nm (second cascade). Third, a dispersion-flattened fiber with low-dispersion at least between 1310 nm and 1390 nm. The reduced dispersion slope of such a dispersion-flattened fiber increases significantly the bandwidth for PA or 4WM.

Exemplary 1240 nm pump lasers include: (a) an 1117 nm cladding-pumped fiber laser followed by a coupler-based or grating-based Raman oscillator cavity (with gratings for 1117 nm, 1175 nm and 1240 nm); (b) an optically-pumped semiconductor laser; or (c) a chromium-doped forsterite laser. At one end of the fiber, a 1240 nm retro-reflector 45 can be placed to increase pumping conversion efficiency. The retro-reflector can be a dichroic mirror or a 1240 nm grating. The input and output ports can be WDM couplers, and isolators can be used at the input and output ports to prevent lasing due to spurious feedback. A counter-propagating geometry can average out noise fluctuations in this open-loop configuration. A co-propagating geometry can be used.

Figure 10:
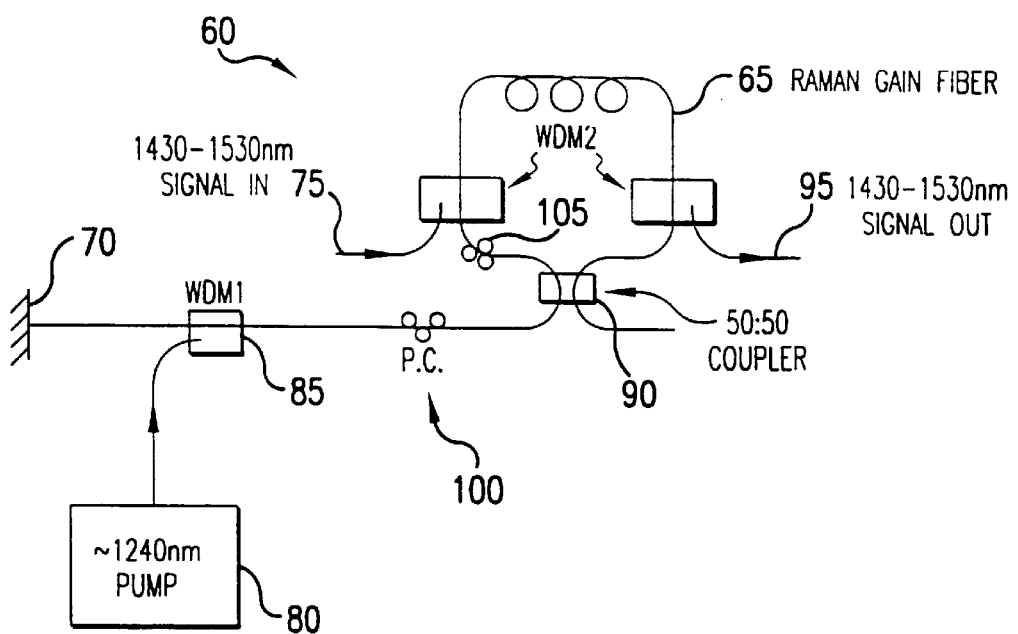
FIG. 10 is a schematic illustration of a second embodiment of an NLPA using a Sagnac Raman cavity that is pumped at 1240 nm.

To reduce the pump power requirements, a broadband cavity such as the Sagnac Raman cavity can be used in some embodiments. FIG. 10 illustrates an embodiment of the NLPA that uses a Sagnac Raman cavity design with a 1240 nm pump. Referring to FIG. 10, the Sagnac Raman cavity of the NLPA 60 can be formed by a broadband mirror 70 and a loop mirror comprising a Raman gain fiber 65 and an optical coupler 90 connected thereto. An optical signal can have a wavelength between 1430 nm to 1530 nm input through an input port 75 to the Raman gain fiber 65. A pumping laser 80 can operate at a wavelength 1240 nm and can generate a pumping light that pumps the fiber 65 through a coupler 85. The optical signal can be amplified and spectrally broadened in the fiber by nonlinear polarization, and output through an output port 95. The configuration can be arranged so that the optical signal has a wavelength greater than the zero-dispersion wavelength of the fiber, which in turn can be greater than the pumping wavelength of 1240 nm.

The Raman gain fiber can have the same characteristics as described above for the open-loop design. Similarly, the pumping lasers used in the first embodiment can be used in this second embodiment. The broadband NLPA may further include a polarization controller 100 in the Sagnac Raman cavity for controlling polarization state. In other embodiments, if the fiber is polarization maintained, the polarization controller can be unnecessary. The optical coupler 90 is nominally 50:50 at least for the optical signal having a wavelength between about 1240 nm and 1430 nm. The coupler 85 can be a WDM coupler that can transmit at least at a wavelength between about 1300 nm and 1430 nm. The input port and output port each comprises a WDM coupler which can transmit at least at a wavelength between about 1240 nm and 1425 nm. One embodiment of the Sagnac Raman cavity has a passive noise dampening property that leads to quieter cascading of various Raman orders.

Figure 11:
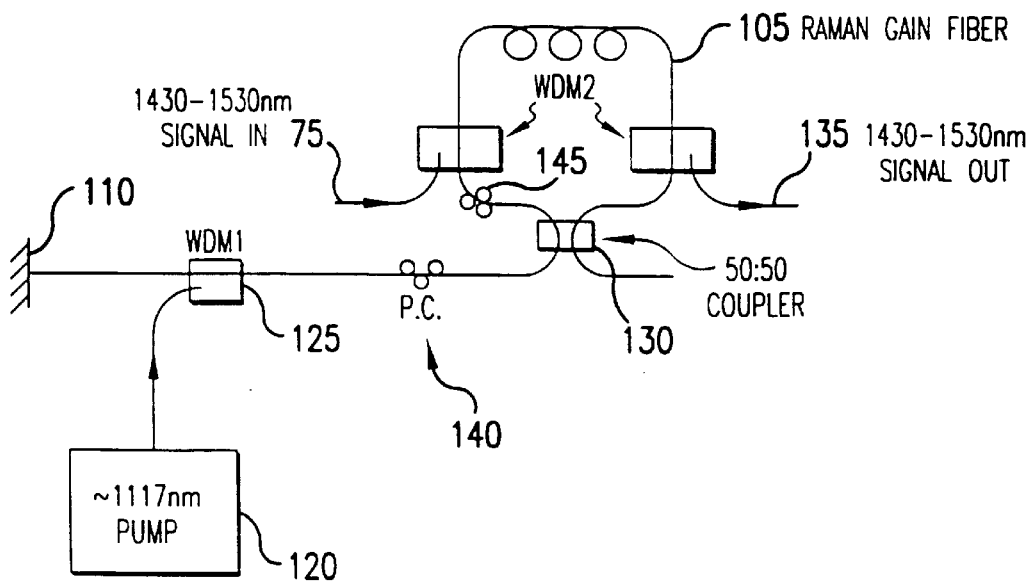
FIG. 11 is a schematic illustration of a third embodiment of an NLPA using a Sagnac Raman cavity that is pumped at 1117 nm.

In various embodiments, a Sagnac Raman cavity can be used for all five Raman cascade orders between 1117 nm and the low-loss window. FIG. 11 illustrates a third embodiment of a five-order Sagnac Raman amplifier for NLPA operation. A cladding-pumped fiber laser operating around 1117 nm can be used as a pumping laser 120. Different fiber combinations embodiment can be used. The fibers can have a cut-off wavelength below 1117 nm to accommodate single-mode operation for the pump. An optical coupler 130 can be nominally 50:50 at least for the optical signal having the wavelength between about 1117 nm and 1430 nm. A coupler 125 can be a WDM coupler that can transmit at least at wavelengths between about 1165 nm and 1430 nm. Moreover, the input and output ports each comprises a WDM coupler which can transmit at least at wavelengths between about 1117 nm and 1425 nm. Although the wavelength range of the various components increases, this configuration can lead to an even broader gain band since the pump bandwidth is allowed to increase even during the first two cascades between 1117 nm and 1240 nm for some embodiments. Also, the noise dampening property of the Sagnac cavity can be used over all five Raman orders for some embodiments.

Some embodiments include an NLPA. An optical signal having a wavelength λ is input through an input port into a distributed gain medium having zero-dispersion at a wavelength $\lambda_0$, such as an optical fiber, which can be pumped by a pumping light from a pump source operated at a wavelength $\lambda_p$, wherein $\lambda \geq \lambda_0 \geq \lambda_p$. The pumping light can cascade through the distributed gain medium a plurality of Raman orders including an intermediate order having a wavelength $\lambda_r$ at a close proximity to the zero-dispersion wavelength $\lambda_0$ to phase match four-wave mixing (if $\lambda_r < \lambda_0$) or parametric amplification (if $\lambda_r > \lambda_0$). The amplified and spectrally broadened optical signal is output through an output port.

The above embodiments demonstrate that a single NLPA can accommodate the full bandwidth of the low-loss window. Moreover, the full bandwidth of the low-loss window may be reached by using a parallel optical amplification apparatus having a combination of two or more Raman amplifiers and rare earth doped amplifiers. In some embodiments, the NLPAs and EDFAs are used.

Figure 12:
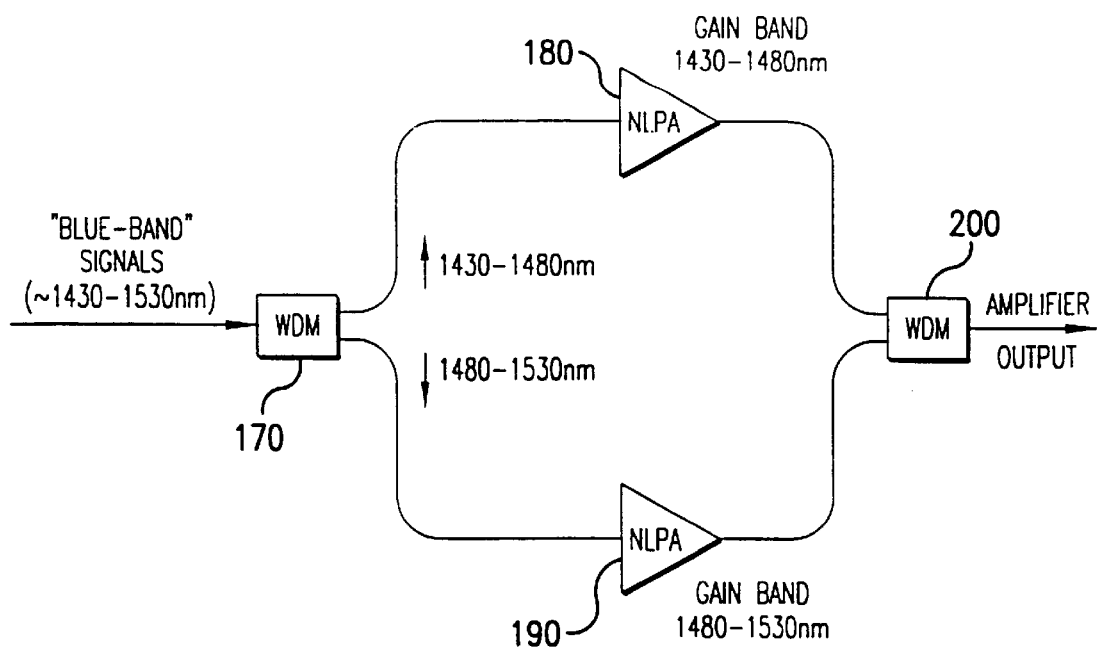
FIG. 12 is a schematic illustration of a first embodiment of a parallel optical amplification apparatus having two stages of NLPAs.

FIG. 12 shows a first embodiment of the parallel optical amplification apparatus using a combination of two NLPAs for a range of wavelengths between 1430 nm and 1530 nm. Referring to FIG. 12, a divider 170 divides an optical signal having a wavelength between 1430 nm to 1530 nm at a predetermined wavelength, such as 1480 nm, into a first beam having a wavelength less than the predetermined wavelength and a second beam having a wavelength greater than the predetermined wavelength in some embodiments. The first beam is input into a first NLPA 180 for amplification and spectral broadening therein. The second beam is input into a second NLPA 190 for amplification and spectral broadening therein. Outputs from the first and second NLPAs can be combined by a combiner 200 to produce an amplified and spectrally broadened optical signal. The input port 170 and output port 200 can be preferably WDM couplers in some embodiments.

In other embodiments the first NLPA 180 can be optimized for 1430–1480 nm and centered at 1455 nm, while the second NLPA can be optimized for 1480–1530 nm and centered at 1505 nm. From Table 1, these two windows can be achieved in a five-order cascade by starting with a pump wavelength of about 1100 nm for the short-wavelength side and a pump wavelength of about 1130 nm for the long-wavelength side. For the short-wavelength side, the fiber can have a zero-dispersion around 1365 nm, while for the long-wavelength side, the fiber zero-dispersion can be around 1328 nm or 1410 nm.

The narrower-bandwidth for each NLPA can lead to an increased efficiency for each amplifier in some embodiments. Furthermore, the components may be more easily manufactured, since the wavelength window is not as large. The multiple amplifiers in some embodiments may allow for gradual upgrades of systems, adding bandwidth to the EDFA window as needed.

Figure 13:
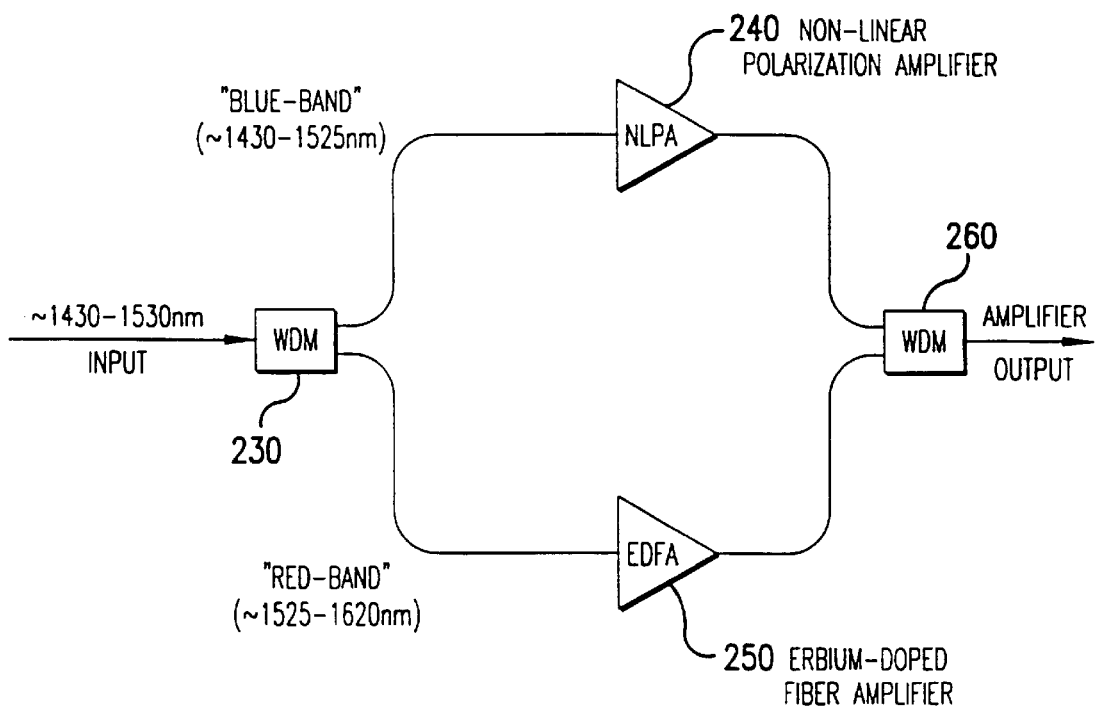
FIG. 13 is a schematic illustration of a second embodiment of a parallel optical amplification apparatus that is a combination of an EDFA and an NLPA.

A spectrum of 1430–1620 nm in the low-loss window can be amplified and spectrally broadened by using a parallel optical amplification apparatus comprising Raman amplifiers and rare earth doped amplifiers. FIG. 13 describes a second embodiment of the parallel optical amplification apparatus. The amplification apparatus comprises a broadband NLPA 240 and a EDFA 250. A divider 230 of the apparatus divides an optical signal having a wavelength between 1430 nm and 1620 nm at a predetermined wavelength, preferably at 1525 nm, into a first beam having a wavelength less than the predetermined wavelength and a second beam having a wavelength greater than the predetermined wavelength in some embodiments. The broadband NLPA 240 receives the first beam and produces an amplified broadband first beam. The EDFA 250 receives the second beam and produces an amplified broadband second beam. A combiner 260 combines the amplified and spectrally broadened first and second beams to produce an amplified broadband optical signal. Other embodiments can have WDM couplers for the divider 230 and the combiner 260.

To use some embodiments with multi-wavelength WDM channels, at the output of the amplifier, gain can be equalized. This wavelength dependency or nonuniformity of the gain band can have little impact on single-channel transmission. However, it can render the amplifier unsuitable for multichannel operation through a cascade of amplifiers. As channels at different wavelengths propagate through a chain of amplifiers, they can accumulate increasing discrepancies between them in terms of gain and signal-to-noise ratio. Using gain-flattening elements can significantly increase the usable bandwidth of a long chain of amplifiers. For example, the NLPA can be followed by a gain flattening element to provide gain equalization for different channels in some embodiments. Alternately, the gain flattening element could be introduced directly into the Sagnac interferometer loop in other embodiments, such as in FIG. 10 or 11.

Due to the high pump power requirements of Raman amplifiers, some embodiments include higher efficiency Raman amplifiers, where the efficiency can be defined as the ratio of signal output to pump input. In one embodiment, the efficiency can be improved to the point that laser diodes (LD's) can be used to directly pump the Raman amplifier. As an exemplary benchmark, for a dual stage amplifier made from dispersion-shifted fiber (DSF) with a gain of >15 dB and an electrical noise figure of <6 dB, a pump power of about 1W can be required from the Raman oscillator or pump laser. This power level can require the combined powers from about eight LD's in one embodiment. If the pump requirements could be dropped by a factor of four or so, the pump powers could be achieved with the combination of two LD's that are polarization multiplexed in another embodiment. In one embodiment, four LD's could be used to provide more than 0.5W of power, and the remaining improvement factor could be used to reduce the gain fiber lengths.

One embodiment improves the efficiency of Raman amplifiers by increasing the effective nonlinearity of the fiber used as the gain medium. The effective nonlinear coefficient for the fiber can be defined as $$\gamma = \frac{2\pi}{\lambda} \frac{n_2}{A_{\it eff}}$$

where $n_2$ is the nonlinear index of refraction and $A_{\it eff}$ is the effective area of the fiber. The Raman gain coefficient can be directly proportional to $\gamma$. The Raman coefficient is the imaginary part of the nonlinear susceptibility while the index is proportional to the real part of the susceptibility, and the nonlinear index and Raman gain will be related by the so-called Kramers-Kronig relations. For a dispersion shifted fiber at 1550 nm wavelength with an $n_2=2.6\times10^{-16}$ cm$^2$/W and an $A_{\it eff}=50$ $\mu$m$^2$, the nonlinear coefficient can be about $\gamma=2$ W$^{-1}$km$^{-1}$. If this value is raised to over 3 W$^{-1}$km$^{-1}$, then the pump power or fiber lengths can be reduced in proportion to the increase in nonlinear coefficient.

Beyond the constraint on the Raman gain coefficient, the dispersion in the amplifier can be restricted. To maintain a relatively low level of dispersion in the vicinity of the signal wavelengths, the zero dispersion wavelength $\lambda_o$ can be in close proximity to the operating wavelength. For single-channel, high-bit-rate systems, one embodiment minimizes the dispersion by placing the signal wavelength within 10 mn of the $\lambda_o$. For some embodiments of multi-wavelength WDM systems, where the channels can interact through four-wave mixing in the vicinity of $\lambda_o$, a dispersion-managed fiber can be used. A dispersion-managed fiber can have a locally high dispersion but a path-averaged value for dispersion close to zero by combining lengths of plus and minus values for the dispersion around the operating band. For the operating wavelength band, some segments of fiber can have $\lambda_o$ at shorter wavelengths and some segments of fiber can have $\lambda_o$ at longer wavelengths.

By proper design of the fiber, higher nonlinearity and lower dispersion can be achieved. For example, for operation in the S-band around 1520 nm, high nonlinearity fibers have been produced. The fiber core can have a modified parabolic refractive index profile with a $\Delta_{peak}=2\%$. Three exemplary fibers have zero dispersion wavelengths of 1524 nm, 1533 nm and 1536 nm. Such fibers can have a dispersion slope of 0.043 ps/nm$^2$-km, and the loss at 1550 nm can be approximately 0.6 dB/km. The nonlinear coefficient can be $\gamma=9$ W$^{-1}$km$^{-1}$, or a factor of 4.5x higher than in DSF. The enhancement can be attributed to two factors: a smaller effective area and a higher germanium content. The effective area can be reduced to about $A_{\it eff}=16.5$ $\mu$m$^2$, or about a factor of 3.3 less than in DSF. Also, the nonlinear index of refraction is about 1.35x larger than in DSF due to the extra germanium used to increase $\Delta_{peak}$ from 1% in DSF to 2% for the high nonlinearity fiber. In addition the mode field diameter at 1550 nm can be measured to be 4.67 $\mu$m.

For the gain fiber used in the Raman amplifier, a figure-of-merit for the fiber can be defined in some embodiments. A figure-of-merit that can be measured and indicate amplifier performance is the ratio of the Raman gain coefficient to the loss at the signal wavelength. The higher this figure-of-merit, the better the performance of the amplifier. This figure-of-merit for different fibers in some embodiments is provided in Table 1. In one embodiment the lowest figure-of-merit is found for standard (non-dispersion-shifted) SMF-28 fiber. This fiber can have a low germanium content and a relatively large $A_{\it eff}=86$ $\mu$m$^2$. The figures-of-merit for the high-nonlinearity (Hi-NL) fiber can exceed the other fibers, with a value about two-fold larger than Lucent True-wave fiber in one example. Although the DCF's can have a relatively large figure-of-merit for Raman amplification, they can have very large dispersion coefficients for S-band signals.

TABLE 1

Comparison of Raman gain figure-of-merit for different fibers measured.

| Fiber Type | Gain [dB/W-km] @ 1500 nm | Loss [dB/km] @ 1500 nm | Figure-of-Merit |
|---|---|---|---|
| Corning SMF-28 | 2.2 | 0.19 | 11.6 |
| Lucent True-Wave | 3.3 | 0.21 | 15.7 |
| Corning SMF-DS | 4.0 | 0.2 | 20.0 |
| Corning DCF | 11.75 | 0.445 | 26.4 |
| Lucent DCF | 13.72 | 0.5 | 27.6 |
| Hi-NL | 18.0 | 0.6 | 30.0 |

Figure 14:
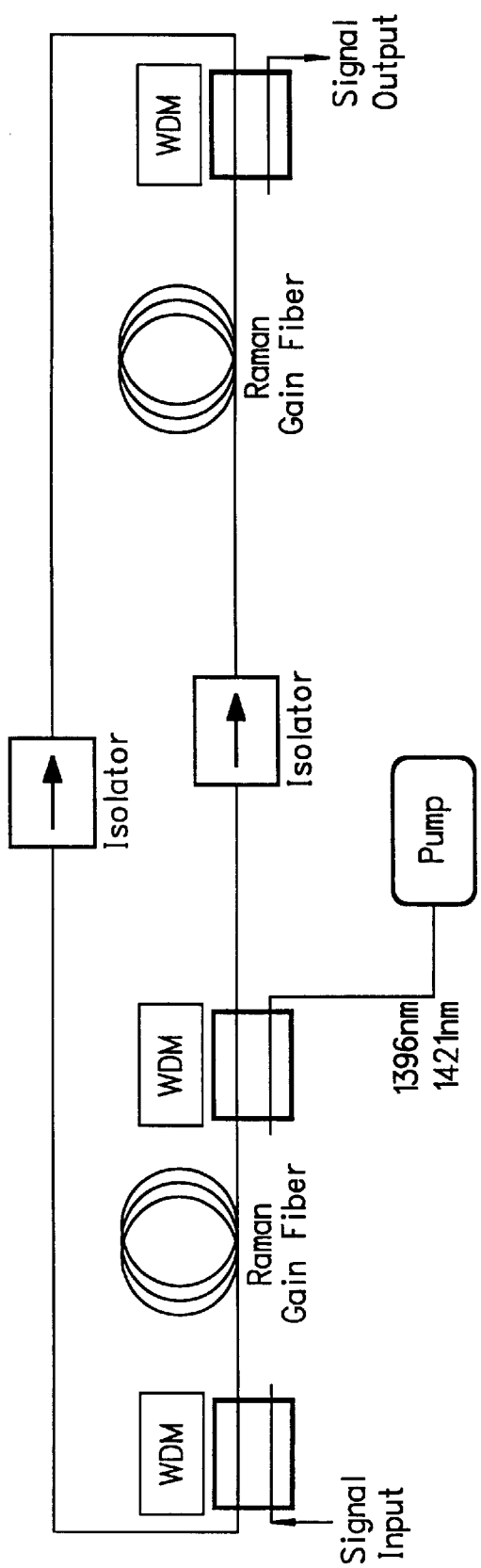
FIG. 14 is a schematic diagram of one embodiment of a dual stage amplifier.
Figure 15:
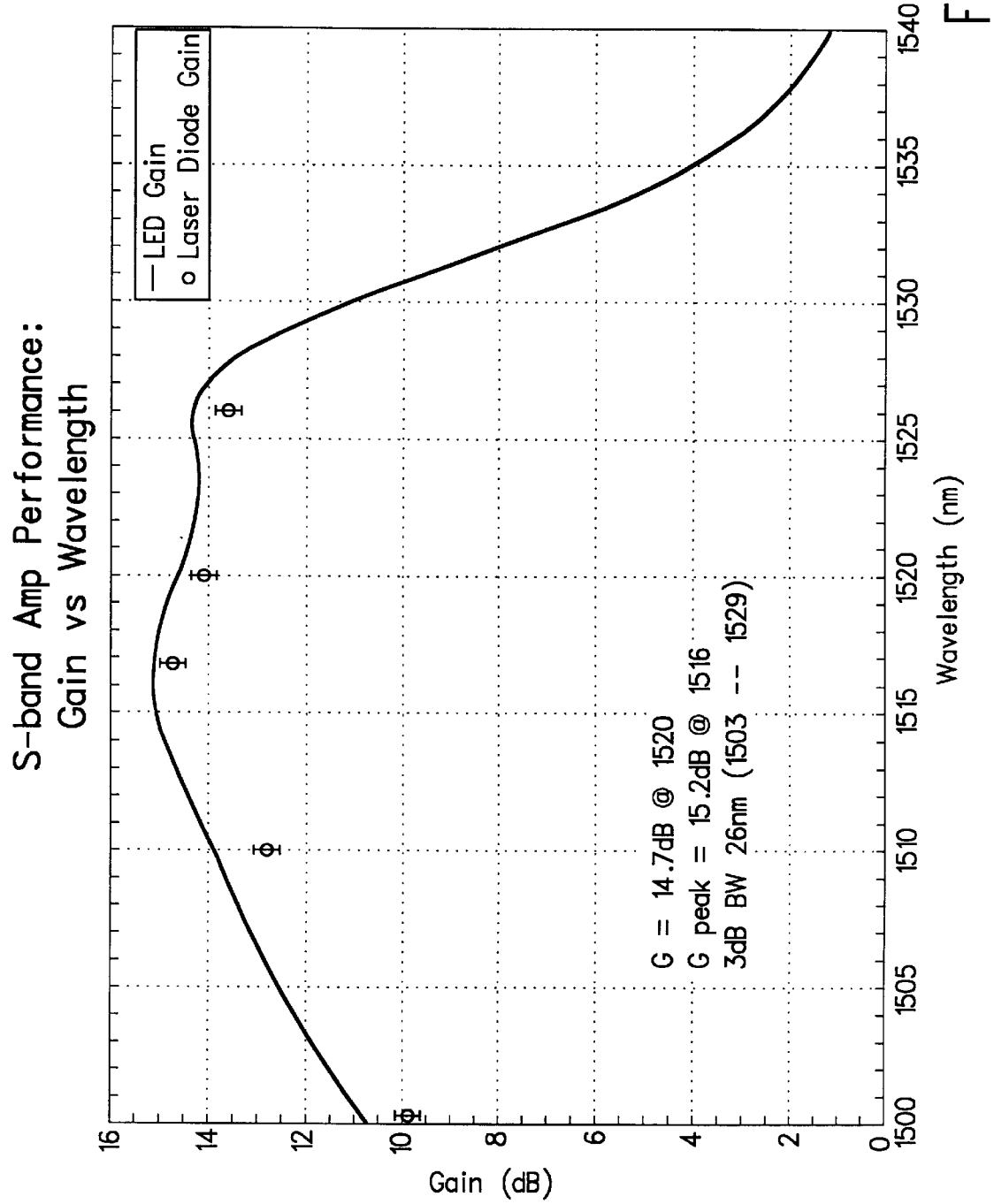
FIG. 15 is a graph of gain versus wavelength for an S band dual stage amplifier, such as for the embodiment of FIG. 14.
Figure 16:
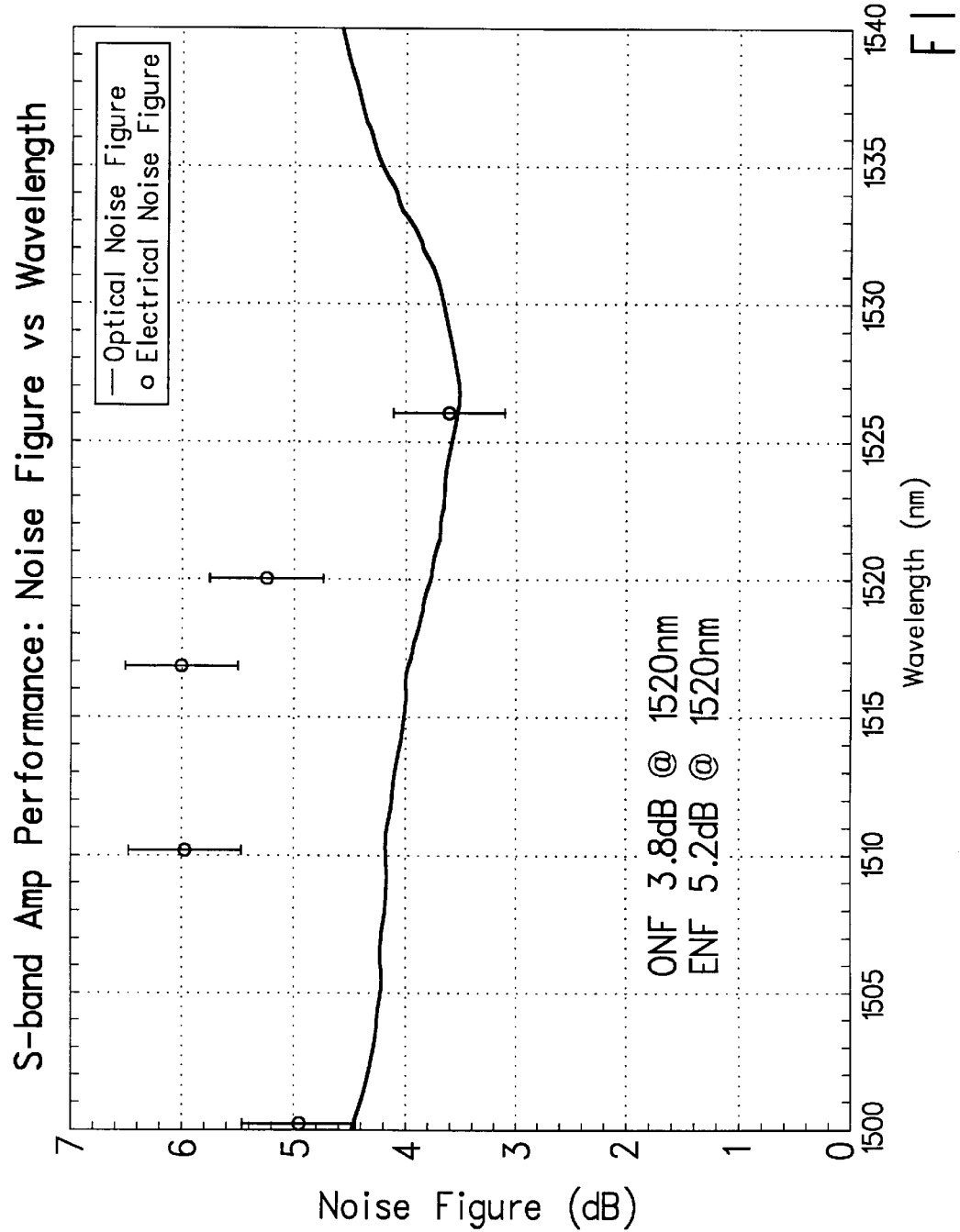
FIG. 16 is a graph of noise figure versus wavelength for an S band dual stage amplifier, such as for the embodiment of FIG. 14.
Figure 17:
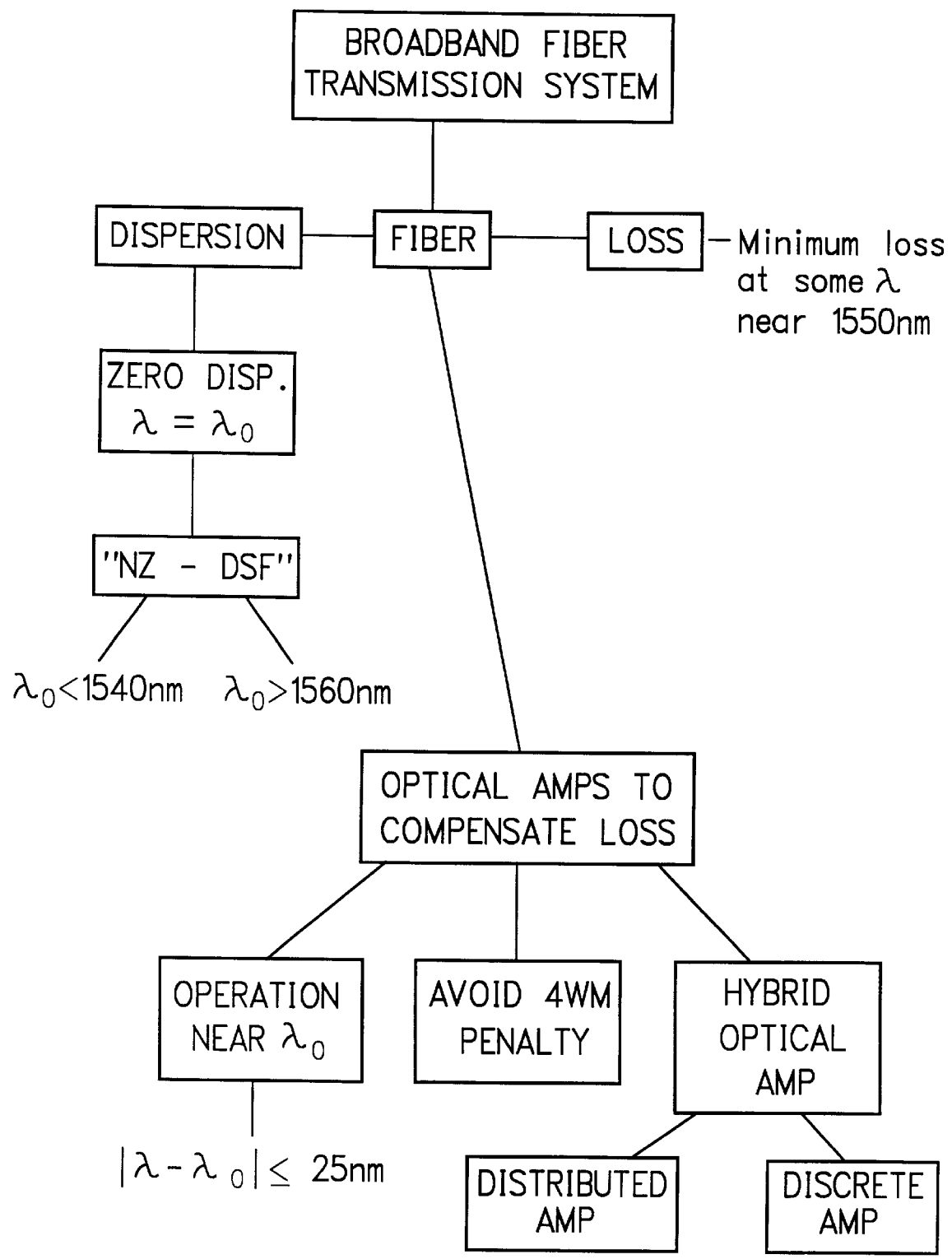
FIG. 17 is a block chart of various embodiments of uses of amplifiers.

One embodiment with Hi-NL fiber has significant improvements in terms of fiber length and pump power used in a Raman amplifier. One embodiment has an amplifier made out of Lucent True-Wave fiber. The specifications for the unit can be: low dispersion around 1520 nm, 15 dB of peak gain, electrical and optical NF under 6 dB, and multi-path interference (MPI) under 50 dB. A two-stage design for the Raman amplifier can be used, as illustrated in FIG. 14. In particular, 6 km of True-Wave fiber can be used in the first stage and 10–12 km of fiber can be used in the second stage. The measured performance of the amplifier can be: peak gain of 15.2 dB at 1516 nm, 3 dB bandwidth of 26 nm (between 1503–1529 nm), and electrical and optical noise figure under 6 dB. For example, the gain versus wavelength and noise figure versus wavelength for the unit is illustrated in FIGS. 15 and 16. This performance can have a pump power of about 1.0 W at 1421 nm.

In one embodiment, the True-Wave fiber in this design is replaced with Hi-NL fiber. Reductions in fiber lengths and pump power requirements can be achieved. The Hi-NL fiber can meet the dispersion requirement in some embodiments. The DCF fibers can lead to the introduction of large amounts of dispersion. Referring to the Table 1 comparison, the fiber lengths can be chosen to keep roughly the same amount of net loss. In one embodiment, fiber lengths can be roughly 2 km for the first stage and 3.3–4 km for the second stage. Pump power requirements can be lowered by the ratio of figures-of-merit, or roughly to 0.5W. in various embodiments, this power range can be provided by the Raman oscillator, or by polarization and wavelength multiplexing 3–4 LD's together. Hi-NL fiber can reduce the size of the amplifier as well as permit LD pumping in some embodiments.

The fiber can have single-mode operation for the pump as well as the signal wavelengths in some embodiments. Cut-off wavelength $\lambda_c$ of the fiber can be shorter than any of the pump wavelengths in some embodiments. The pump can be multi-mode, and noise can be introduced from the beating between modes in other embodiments.

Various embodiments have reduction of the Raman amplifier size and pump requirements while maintaining low net dispersion at the operating wavelengths, and include one or more of:

(A) A Raman amplifier using a gain fiber characterized in that nonlinear coefficient $\gamma > 3$ $W^{-1}km^{-1}$ zero dispersion wavelength in the range of $1300 < \lambda_o < 1800$ nm, depending more precisely on the specifications Loss over the operating wavelength of <2 dB/km, with a preference for loss <1 dB/km (B) A Raman amplifier using a dispersion managed gain fiber characterized in that nonlinear coefficient $\gamma > 3$ $W^{-1}km^{-1}$ dispersion management done using segments of fiber with zero dispersion wavelength in the range of $1300 < \lambda_o < 1800$ nm, depending more precisely on the specifications. Given an operating band, certain fiber segments have $\lambda_o$ less than the operating band and other fiber segments have $\lambda_o$ greater than the operating band. The local dispersion can be kept high, while the path average dispersion can be close to zero in the signal band.

Loss over the operating wavelength of certainly <2 dB/km, with a preference for loss <1 dB/km (C) Fibers as in (A) or (B) with cut-off wavelength shorter than any of the pump wavelengths.

(D) A Raman amplifier as described in (A) that is pumped by LD's. For two or more LD's, the power can be combined by using polarization and wavelength multiplexing using polarization beam combiners and wavelength-division-multiplexers.

(E) A Raman amplifier as in (B) that is pumped by LD's. For two or more LD's, the power can be combined by using polarization and wavelength multiplexing using polarization beam combiners and wavelength-division-multiplexers.

(F) At least a two-stage Raman amplifier that uses the improvements in (A),(B),(C),(D) or (E).

(G) Other factors as above with different numerical ranges

Some embodiments include standard dispersion fiber, i.e., fibers with zero dispersion wavelength around 1310 nm. The zero dispersion wavelength can fall in the S− or S+-bands in some embodiments. For example, this is true for so-called non-zero-dispersion-shifted fiber (NZ-DSF). In these fibers, it can be difficult to run multi-wavelength WDM channels due to cross-talk from four-wave mixing. Four-wave-mixing can require phase matching, and the phase matching can be easier to satisfy in the neighborhood of the zero dispersion wavelength. One embodiment is a broadband fiber transmission system with non-zero dispersion fiber that has zero dispersion wavelengths less than 1540 nm or greater than 1560 nm that uses optical amplifiers to compensate for loss.

WDM can maximize capacity in any given band in some embodiments. Hybrid amplifiers can be useful in the vicinity of the zero dispersion wavelength in some embodiments. NZ-DSF fibers can have a zero dispersion wavelength either <1540 nm or >1560 nm in some embodiments. For operation near the zero dispersion wavelength, e.g., $|\lambda - \lambda_o| < 25$ nm, the four-wave-mixing penalty can be avoided by using hybrid optical amplifiers in one embodiment. Since the effective NF of hybrid amplifiers can be lower than for discrete amplifiers, the power levels for the signals can be reduced to the point that four-wave-mixing can no longer be a limitation, in another embodiment.

One embodiment of a broadband nonlinear polarization amplifier comprises an input port, a distributed gain medium, one or more semiconductor lasers, and an output port. The input port can input an optical signal having a wavelength $\lambda$. The input port can be a WDM coupler. The wavelength $\lambda$ can be between 1400 nm and 1650 nm. A sign of dispersion at the wavelength $\lambda$ can be negative. The distributed gain medium can receive the optical signal and can amplify the optical signal through nonlinear polarization. The distributed gain medium can have zero-dispersion at wavelength $\lambda_0$, which can be in the range of 1300 to 1800 nm. The distributed gain medium can be an optical fiber, or a dispersion compensating optical fiber. The distributed gain medium can be a dispersion managed gain medium with a plurality of fiber segments each having a zero dispersion wavelength in the range of 1300 to 1800 nm. At least a portion of gain produced by the distributed gain medium can be Raman gain. The distributed gain medium can have a nonlinear coefficient greater than 2 W-1km-1, or greater than 3 W-1km-1. The distributed gain medium can have a cut-off wavelength shorter than the wavelengths $\lambda_p$. The distributed gain medium can have a loss at the wavelength $\lambda$ of less than 2 dB/km, or less than 1 dB/km. A magnitude of dispersion at the wavelength $\lambda$ can be less than 50 ps/nm-km, less than 40 ps/nm-km, less than 30 ps/nm-km, or less than 20 ps/nm-km. One or more semiconductor lasers can be operated at wavelengths $\lambda_p$. One or more semiconductor lasers can generate a pump light to pump the distributed gain medium. The output port can output the amplified optical signal. The output port can be a WDM coupler.

One embodiment of a broadband fiber transmission system comprises a transmission line and one or more semiconductor lasers. The transmission line can have at least one zero dispersion wavelength $\lambda_0$. The transmission line can transmit an optical signal of a wavelength $\lambda$. The optical signal can have a wavelength $\lambda$ in the range of 1400 nm to 1530 nm, and/or in the range of 1530 nm to 1650 nm. A sign of dispersion at the wavelength $\lambda$ can be negative. A signal wavelength at $\lambda$ can be sufficiently low in power to avoid at least one fiber non-linearity effect, such as four-wave mixing and/or modulation instability. The wavelength $\lambda$ can be within, for example, 30 nm, or within 20 nm, of at least one zero dispersion wavelength $\lambda_0$. The transmission line can include a Raman amplifier. The Raman amplifier can amplify the optical signal through Raman gain. The Raman amplifier can be a distributed Raman amplifier. The Raman amplifier can have sufficient gain to compensate for losses in the transmission line. At least a portion of the transmission line can have a magnitude of dispersion at the wavelength A less than 50 ps/nm-km, less than 40 ps/nm-km, less than 30 ps/nm-km, or less than 20 ps/nm-km. One or more semiconductor lasers can be operated at wavelengths $\lambda_p$. One or more semiconductor lasers can generate a pump light to pump the Raman amplifier. The wavelength $\lambda$ can be close to at least one zero dispersion wavelength $\lambda_0$. At least one zero dispersion wavelength $\lambda_0$ can be less than 1540 nm and/or greater than 1560 nm.

One embodiment of a broadband fiber transmission system comprises a transmission line and one or more semiconductor lasers. The transmission line can have at least one zero dispersion wavelength $\lambda_0$. The transmission line can transmit an optical signal of a wavelength $\lambda$. The optical signal can have the wavelength $\lambda$ in the range of 1400 nm to 1530 nm, and/or in the range of 1530 nm to 1650 nm. A signal wavelength at $\lambda$ can be sufficiently low in power to avoid at least one fiber non-linearity effect, such as four-wave mixing and/or modulation instability. The wavelength $\lambda$ can be within 30 nm, or within 20 nm, of at least one zero dispersion wavelength $\lambda_0$. A sign of dispersion at the wavelength $\lambda$ can be negative. The transmission line can include a Raman amplifier and a discrete optical amplifier that amplify the optical signal. The Raman amplifier can be a distributed Raman amplifier. The discrete optical amplifier can be a rare earth doped amplifier, an erbium doped fiber amplifier, a Raman amplifier, and/or a thulium doped fiber amplifier. The amplifiers can have sufficient gain to compensate for losses in the transmission line. At least a portion of the transmission line can have a magnitude of dispersion at the wavelength $\lambda$ less than 50 ps/nm-km, less than 40 ps/nm-km, less than 30 ps/nm-km, or less than 20 ps/nm-km. One or more semiconductor lasers can be operated at wavelengths $\lambda_p$. One or more semiconductor lasers can generate a pump light to pump the amplifiers. The wavelength $\lambda$ can be close to at least one zero dispersion wavelength $\lambda_0$. At least one zero dispersion wavelength $\lambda_0$ can be less than 1540 nm and/or greater than 1560 nm.

An embodiment of a amplifier module comprises a transmission fiber, a dispersion compensating fiber, a first intermediate fiber, and at least a first pump source. The transmission fiber can be configured to transmit a signal. The signal can be, for example, in the wavelength range of 1400 to 1650 nm. The signal can include multiple wavelengths. The transmission fiber can be coupled to a second pump source that produces a second pump beam. The first and second pump beams can be separated by at least 15 nm, or at least 20 nm, of wavelength. At least a portion of the dispersion compensating fiber can have a negative sign of dispersion and an absolute magnitude of dispersion of at least 50 ps/fm-km for a majority of wavelengths in the signal, or at least a portion of the wavelengths in the signal. The dispersion compensating fiber can include at least two dispersion compensating fibers. The first intermediate fiber can couple the dispersion compensating fiber with the transmission fiber. The first intermediate fiber can have a mode field diameter that can be less than a mode field diameter of the transmission fiber and greater than a mode field diameter of the dispersion compensating fiber. The first intermediate fiber can couple the dispersion compensating fiber with the transmission fiber with no more than 1 dB of loss over at least a portion of a wavelength range of the first pump source. The first intermediate fiber can be integrally formed with the transmission fiber, and/or with the dispersion compensating fiber, and can have a varying mode field diameter. The first intermediate fiber can be non-integrally formed with at least one of, or both of, the transmission fiber and the dispersion compensating fiber. The first intermediate fiber can have substantially tapered geometric configurations. At least the first pump source can be coupled to the transmission fiber. At least the first pump source can produce a first pump beam that creates Raman gain in the dispersion compensating fiber. The first pump source can include at least one semiconductor diode laser. The amplifier module provides net gain to a signal in the transmission fiber of at least 5 dB, or at least 10 dB. The amplifier module can have sufficient gain to compensate for signal losses in the transmission line. The amplifier module can further comprise a wavelength selective coupler. The wavelength selective coupler can be coupled to an output of the dispersion compensating fiber. The wavelength selective coupler can provide for counter-directional pumping.

One embodiment of an amplifier module comprises a transmission fiber, a dispersion compensating fiber, and at least a first pump source. The transmission fiber can have a relative dispersion slope. The relative dispersion slope can be the dispersion slope divided by the dispersion. The transmission fiber can be configured to transmit a signal. The signal can be in the wavelength range of 1400 to 1650 nm. The dispersion compensating fiber can have a relative dispersion slope. The relative dispersion slope can be the dispersion slope divided by the dispersion. The dispersion compensating fiber can be coupled to the transmission fiber. The dispersion compensating fiber can have a sign of dispersion that can be opposite a sign of dispersion of the transmission fiber. At least a portion of the dispersion compensating fiber can have a negative sign of dispersion and an absolute magnitude of dispersion of at least 50 ps/nm-km for a majority of wavelengths in the signal, or for at least a portion of wavelengths in the signal. A difference between the relative dispersion slopes of the transmission fiber and the dispersion compensating fiber can be no greater than 0.0032/nm over, for example, at least a portion of a signal wavelength range, such as over at least 20 mn of a signal wavelength range, or over at least 50 nm of a signal wavelength range. The difference between the relative dispersion slopes can be no greater than 0.001/nm over, for example, at least a portion of a signal wavelength range. At least a first pump source can be coupled to the transmission fiber. At least a first pump source can produce a first pump beam that creates Raman gain in the dispersion compensating fiber. The amplifier module can further comprise a first intermediate fiber. The first intermediate fiber can couple the dispersion compensating fiber with the transmission fiber. The first intermediate fiber can have a mode field diameter that can be less than a mode field diameter of the transmission fiber and greater than a mode field diameter of the dispersion compensating fiber. The amplifier module can provide net gain to a signal in the transmission fiber of at least 5 dB, or of at least 10 dB. The amplifier module can have sufficient gain to compensate for signal losses in the transmission line.

One embodiment of an amplifier module comprises a transmission fiber, a dispersion compensating fiber, and at least a first pump source. The transmission fiber can be configured to transmit a signal. The signal can be in the wavelength range of 1400 to 1650 nm. The dispersion compensating fiber can be coupled to the transmission fiber. The dispersion compensating fiber can have a dispersion sign that can be opposite a sign of the transmission fiber. At least a portion of the dispersion compensating fiber can have a negative sign of dispersion and an absolute magnitude of dispersion of at least 50 ps/nm-km for a majority of wavelengths in the signal, or for at least a portion of the wavelengths in the signal. At least the first pump source can be coupled to the transmission fiber. At least the first pump source can produce a depolarized first pump beam that creates Raman gain in the dispersion compensating fiber. The first pump source can include at least two polarized pump sources that can be polarization multiplexed. The first pump source can include a polarization scrambler. The first pump source can include a non-polarized pump source. The non-polarized pump source can be a fiber laser. The amplifier module can further comprise a first intermediate fiber. The first intermediate fiber can couple the dispersion compensating fiber with the transmission fiber. The first intermediate fiber can have a mode field diameter that can be less than a mode field diameter of the transmission fiber and greater than a mode field diameter of the dispersion compensating fiber. The amplifier module provides net gain to a signal in the transmission fiber of at least 5 dB, or of at least 10 dB. The amplifier module can have sufficient gain to compensate for signal losses in the transmission line.

One embodiment of an optical fiber communication system comprises a transmitter, a receiver, a transmission fiber, a dispersion compensating fiber, a first intermediate fiber, and at least a first pump source. The transmission fiber can be coupled to the transmitter and receiver. The transmission fiber can have chromatic dispersion at a system wavelength. The dispersion compensating fiber can have at least a portion with a negative sign of dispersion and an absolute magnitude of dispersion of at least 50 ps/nm-km. The first intermediate fiber can couple the dispersion compensating fiber with the transmission fiber. The first intermediate fiber can have a mode field diameter that can be less than a mode field diameter of the transmission fiber and greater than a mode field diameter of the dispersion compensating fiber. At least a first pump source can be coupled to the transmission fiber. At least a first pump source can produce a first pump beam that can create Raman gain in the dispersion compensating fiber.

It is understood that various other modifications will be readily apparent to those skilled in the art without departing from the scope and spirit of the invention. Accordingly, it is not intended that the scope of the claims appended hereto be limited to the description set forth herein, but rather that the claims be construed as encompassing all the features of the patentable novelty that reside in the present invention, including all features that would be treated as equivalents thereof by those skilled in the art to which this invention pertains.

What is claimed is:

1. A broadband fiber transmission system, comprising:
   a transmission line comprising at least one zero dispersion wavelength $\lambda_o$ and transmitting an optical signal comprising a wavelength $\lambda$, the transmission line comprising a Raman amplifier that amplifies the optical signal through Raman gain, at least a portion of the transmission line comprises a magnitude of dispersion at the wavelength $\lambda$ between 10 ps/nm-km and 50 ps/nm-kin; and
   one or more semiconductor lasers operated at wavelengths $\lambda_p$ for generating a pump light to pump the Raman amplifier, wherein the wavelength $\lambda$ is within thirty (30) nanometers of the at least one zero dispersion wavelength $\lambda_0$ and wherein the at least one zero dispersion wavelength $\lambda_0$ is less than 1540 nm or greater than 1560 nm.

2. The broadband fiber transmission system of claim 1, wherein a sign of dispersion at the wavelength $\lambda$ is negative.

3. The broadband fiber transmission system of claim 1, wherein the Raman amplifier comprises a distributed Raman amplifier.

4. The broadband fiber transmission system of claim 1, wherein the magnitude of dispersion at the wavelength $\lambda$ is less than 40 ps/nm-km.

5. The broadband fiber transmission system of claim 1, wherein the magnitude of dispersion at the wavelength $\lambda$ is less than 30 ps/nm-km.

6. The broadband fiber transmission system of claim 1, wherein the magnitude of dispersion at the wavelength $\lambda$ is less than 20 ps/nm-km.

7. The broadband fiber transmission system of claim 1, wherein the wavelength $\lambda$ is within 20 nm of the at least one zero dispersion wavelength $\lambda_0$.

8. The broadband fiber transmission system of claim 1, wherein the optical signal comprises a wavelength $\lambda$ in the range of 1400 nm to 1530 nm.

9. The broadband fiber transmission system of claim 1, wherein the optical signal comprises a wavelength X in the range of 1530 nm to 1650 nm.

10. The broadband fiber transmission system of claim 1, wherein a signal wavelength at $\lambda$ is sufficiently low in power to avoid at least one fiber non-linearity effect.

11. The broadband fiber transmission system of claim 1, wherein the Raman amplifier comprises sufficient gain to compensate for losses in the transmission line.

12. The broadband fiber transmission system of claim 10, wherein the at least one fiber non-linearity effect comprises four-wave mixing.

13. The broadband fiber transmission system of claim 10, wherein the at least one fiber non-linearity effect comprises modulation instability.

14. A broadband fiber transmission system, comprising:
    a transmission line comprising at least one zero dispersion wavelength $\lambda_o$ and transmitting an optical signal comprising a wavelength $\lambda$, the transmission line comprising a serial combination of a Raman amplifier and a discrete optical amplifier that amplify the optical signal, at least a portion of the transmission line comprises a magnitude of dispersion at the wavelength $\lambda$ less than 50 ps/nm-kin; and
    one or more semiconductor lasers operated at wavelengths $\lambda_p$ for generating a pump light to pump the amplifiers, wherein the wavelength $\lambda$ is within thirty (30) nanometers of the at least one zero dispersion wavelength $\lambda_0$ and wherein the at least one zero dispersion wavelength $\lambda_0$ is less than 1540 nm or greater than 1560 nm.

15. The broadband fiber transmission system of claim 14, wherein a sign of dispersion at the wavelength $\lambda$ is negative.

16. The broadband fiber transmission system of claim 14, wherein the Raman amplifier comprises a distributed Raman amplifier.

17. The broadband fiber transmission system of claim 14, wherein the magnitude of dispersion at the wavelength $\lambda$ is less than 40 ps/nm-km.

18. The broadband fiber transmission system of claim 14, wherein the magnitude of dispersion at the wavelength $\lambda$ is less than 30 ps/nm-km.

19. The broadband fiber transmission system of claim 14, wherein the magnitude of dispersion at the wavelength $\lambda$ is less than 20 ps/nm-km.

20. The broadband fiber transmission system of claim 14, wherein the wavelength $\lambda$ is within 20 nm of the at least one zero dispersion wavelength $\lambda_0$.

21. The broadband fiber transmission system of claim 14, wherein the optical signal comprises the wavelength $\lambda$ in the range of 1400 nm to 1530 nm.

22. The broadband fiber transmission system of claim 14 wherein the optical signal comprises the wavelength $\lambda$ in the range of 1530 nm to 1650 nm.

23. The broadband fiber transmission system of claim 14, wherein the discrete optical amplifier comprises a rare earth doped amplifier.

24. The broadband fiber transmission system of claim 14, wherein the discrete optical amplifier comprises an erbium doped fiber amplifier.

25. The broadband fiber transmission system of claim 14, wherein the discrete optical amplifier comprises a Raman amplifier.

26. The broadband fiber transmission system of claim 14, wherein the discrete optical amplifier comprises a thulium doped fiber amplifier.

27. The broadband fiber transmission system of claim 14, wherein a signal wavelength at $\lambda$ is sufficiently low in power to avoid at least one fiber non-linearity effect.

28. The broadband fiber transmission system of claim 14, wherein the amplifiers comprise sufficient gain to compensate for losses in the transmission line.

29. The broadband fiber transmission system of claim 27, wherein the at least one fiber non-linearity effect comprises four-wave mixing.

30. The broadband fiber transmission system of claim 27, wherein the at least one fiber non-linearity effect comprises modulation instability.

31. A method for transmitting an optical signal over a broadband transmission system, comprising:

transmitting an optical signal comprising a wavelength $\lambda$ through a transmission line comprising at least one zero dispersion wavelength $\lambda_0$, the transmission line comprising a Raman amplifier that amplifies the optical signal through Raman gain, at least a portion of the transmission line comprises a magnitude of dispersion at the wavelength $\lambda$ between 10 ps/nm-km and 50 ps/nm-kin; and introducing to the Raman amplifier a pump light to pump, wherein the wavelength $\lambda$ is within thirty (30) nanometers of the at least one zero dispersion wavelength $\lambda_0$ and wherein the at least one zero dispersion wavelength $\lambda_0$ is less than 1540 nm or greater than 1560 nm.

32. The method of claim 31, wherein the pump light to pump the Raman amplifier is generated by one or more semiconductor lasers operated at wavelengths $\lambda_p$.

33. The method of claim 31, wherein the Raman amplifier comprises a distributed Raman amplifier.

34. The method of claim 31, wherein wherein the magnitude of dispersion at the wavelength $\lambda$ is less than 40 ps/nm-km.

35. The method of claim 31, wherein the magnitude of dispersion at the wavelength $\lambda$ is less than 30 ps/nm-km.

36. The method of claims 31, wherein the magnitude of dispersion at the wavelength $\lambda$ is less than 20 ps/nm-km.

37. The method of claim 31, the wavelength $\lambda$ is within 20 nm of the at least one zero dispersion wavelength $\lambda_0$.

38. The method of claim 31, wherein the optical signal comprises a wavelength $\lambda$ in the range of 1400 nm to 1530 nm.

39. The method of claim 31, wherein the optical signal comprises a wavelength $\lambda$ is in the range of 1530 nm to 1650 nm.

40. The method of claim 31, wherein a signal wavelength at $\lambda$ is sufficiently low in power to avoid at least one fiber non-linearity effect.

41. The method of claim 31, wherein the Raman amplifier comprises sufficient gain to compensate for losses in the transmission line.

42. A method for transmitting an optical signal over a broadband transmission system, comprising:

transmitting an optical signal comprising a wavelength $\lambda$ through a transmission line comprising at least one zero dispersion wavelength $\lambda_0$, the transmission line comprising a serial combination of a Raman amplifier and a discrete optical amplifier that amplify the optical signal, at least a portion of the transmission line comprises a magnitude of dispersion at the wavelength $\lambda$ less than 50 ps/nm-kin; and introducing to the transmission line a pump light to pump at least one of the amplifiers, wherein the wavelength $\lambda$ is within thirty (30) nanometers of the at least one zero dispersion wavelength $\lambda_0$ and wherein the at least one zero dispersion wavelength $\lambda_0$ is less than 1540 nm or greater than 1560 nm.

43. The method of claim 42, wherein the pump light to pump the Raman amplifier is generated by one or more semiconductor lasers operated at wavelengths $\lambda_p$.

44. The method of claim 42, wherein the Raman amplifier comprises a distributed Raman amplifier.

45. The method of claim 42, wherein wherein the magnitude of dispersion at the wavelength $\lambda$ is less than 40 ps/nm-km.

46. The method of claim 42, wherein the magnitude of dispersion at the wavelength $\lambda$ is less than 30 ps/nm-km.

47. The method of claim 42, wherein the magnitude of dispersion at the wavelength $\lambda$ is less than 20 ps/nm-km.

48. The method of claim 42, wherein the wavelength $\lambda$ is within 20 nm of the at least one zero dispersion wavelength $\lambda_0$.

49. The method of claim 42, wherein the optical signal comprises a wavelength $\lambda$ in the range of 1400 nm to 1530 nm.

50. The method of claim 42, wherein the optical signal comprised a wavelength $\lambda$ is in the range of 1530 nm to 1650 nm.

51. The method of claim 42, wherein a signal wavelength at $\lambda$ is sufficiently low in power to avoid at least one fiber non-linearity effect.

52. The method of claim 42, wherein the Raman amplifier comprises sufficient gain to compensate for losses in the transmission line.

* * * * *

UNITED STATES PATENT AND TRADEMARK OFFICE
CERTIFICATE OF CORRECTION

PATENT NO. : 6,693,737 B2
DATED : February 17, 2004
INVENTOR(S) : Mohammed N. Islam It is certified that error appears in the above-identified patent and that said Letters Patent is hereby corrected as shown below:

Title page,
Item [56], References Cited, U.S. PATENT DOCUMENTS, insert

| | | | | | |
|---|---|---|---|---|---|
| -- | 4,063,106 | A | 12/1977 | Ashkin et al. | 307/88.3 |
| | 4,685,107 | A | 8/1987 | Kafka et al. | 372/6 |
| | 4,740,974 | A | 4/1988 | Byron | 372/3 |
| | 4,831,616 | A | 5/1989 | Huber | 370/3 |
| | 5,039,199 | A | 8/1991 | Mollenauer et al. | 359/334 |
| | 5,050,183 | A | 9/1991 | Duling, III | 372/94 |
| | 5,058,974 | A | 10/1991 | Mollenauer | 385/27 |
| | 5,107,360 | A | 4/1992 | Huber | 359/124 |
| | 5,117,196 | A | 5/1992 | Epworth et al. | 359/333 |
| | 5,132,976 | A | 7/1992 | Chung et al. | 372/6 |
| | 5,134,620 | A | 7/1992 | Huber | 372/6 |
| | 5,140,456 | A | 8/1992 | Huber | 359/341 |
| | 5,151,908 | A | 9/1992 | Huber | 372/6 |
| | 5,153,762 | A | 10/1992 | Huber | 359/125 |
| | 5,159,601 | A | 10/1992 | Huber | 372/6 |
| | 5,166,821 | A | 11/1992 | Huber | 359/238 |
| | 5,187,760 | A | 2/1993 | Huber | 385/37 |
| | 5,191,586 | A | 3/1993 | Huber | 372/6 |
| | 5,191,628 | A | 3/1993 | Byron | 385/27 |
| | 5,200,964 | A | 4/1993 | Huber | 372/26 |
| | 5,208,819 | A | 5/1993 | Huber | 372/32 |
| | 5,210,631 | A | 5/1993 | Huber et al. | 359/132 |
| | 5,212,579 | A | 5/1993 | Huber et al. | 359/182 |
| | 5,218,655 | A | 6/1993 | Mizrahi | 385/39 |
| | 5,222,089 | A | 6/1993 | Huber | 372/6 |
| | 5,225,925 | A | 7/1993 | Grubb et al. | 359/341 |
| | 5,226,049 | A | 7/1993 | Grubb | 372/6 |
| | 5,243,609 | A | 9/1993 | Huber | 372/9 |
| | 5,257,124 | A | 10/1993 | Glaab et al. | 359/124 |
| | 5,268,910 | A | 12/1993 | Huber | 372/6 |
| | 5,271,024 | A | 12/1993 | Huber | 372/6 |
| | 5,283,686 | A | 2/1994 | Huber | 359/337 |
| | 5,293,545 | A | 3/1994 | Huber | 359/111 |
| | 5,295,016 | A | 3/1994 | Van Deventer | 359/347 |
| | 5,295,209 | A | 3/1994 | Huber | 385/37 |
| | 5,301,054 | A | 4/1994 | Huber et al. | 359/132 |
| | 5,321,543 | A | 6/1994 | Huber | 359/187 |
| | 5,321,707 | A | 6/1994 | Huber | 372/6 |
| | 5,323,404 | A | 6/1994 | Grubb | 372/6 |
| | 5,331,449 | A | 7/1994 | Huber et al. | 359/125 |
| | 5,359,612 | A | 10/1994 | Dennis et al. | 372/18 |
| | 5,373,389 | A | 12/1994 | Huber | 359/195 |
| | 5,389,779 | A | 2/1995 | Betzig et al. | 250/216 |
| | 5,400,166 | A | 3/1995 | Huber | 359/173 |
| | 5,416,629 | A | 5/1995 | Huber | 359/182 |
| | 5,450,427 | A | 9/1995 | Fermann et al. | 372/18 |
| | 5,467,212 | A | 11/1995 | Huber | 359/168 |
| | 5,473,622 | A | 12/1995 | Grubb | 372/6 |
| | 5,477,555 | A | 12/1995 | Debeau et al. | 372/25 |
| | 5,479,291 | A | 12/1995 | Smith et al. | 359/333 |
| | 5,485,481 | A | 1/1996 | Ventrudo et al. | 372/6 |

UNITED STATES PATENT AND TRADEMARK OFFICE
CERTIFICATE OF CORRECTION

PATENT NO. : 6,693,737 B2
DATED : February 17, 2004
INVENTOR(S) : Mohammed N. Islam It is certified that error appears in the above-identified patent and that said Letters Patent is hereby corrected as shown below:

Title page (cont'd),

| | | | | |
|---|---|---|---|---|
| 5,497,386 | A | 3/1996 | Fontana | 372/18 |
| 5,504,609 | A | 4/1996 | Alexander et al. | 359/125 |
| 5,504,771 | A | 4/1996 | Vahala et al. | 372/94 |
| 5,513,194 | A | 4/1996 | Froberg et al. | 372/6 |
| 5,521,738 | A | 5/1996 | Froberg | 359/184 |
| 5,530,710 | A | 6/1996 | Grubb | 372/6 |
| 5,532,864 | A | 7/1996 | Alexander et al. | 359/177 |
| 5,541,947 | A | 7/1996 | Mourou et al. | 372/25 |
| 5,542,011 | A | 7/1996 | Robinson | 385/24 |
| 5,555,118 | A | 9/1996 | Huber | 359/125 |
| 5,557,442 | A | 9/1996 | Huber | 359/179 |
| 5,577,057 | A | 11/1996 | Frisken | 372/18 |
| 5,579,143 | A | 11/1996 | Huber | 359/130 |
| 5,600,473 | A | 2/1997 | Huber | 359/179 |
| 5,617,434 | A | 4/1997 | Tamura et al. | 372/6 |
| 5,623,508 | A | 4/1997 | Grubb et al. | 372/3 |
| 5,659,351 | A | 8/1997 | Huber | 348/7 |
| 5,659,559 | A | 8/1997 | Ventrudo et al. | 372/6 |
| 5,659,644 | A | 8/1997 | DiGiovanni et al. | 385/31 |
| 5,673,280 | A | 9/1997 | Grubb et al. | 372/3 |
| 5,673,281 | A | 9/1997 | Byer | 372/3 |
| 5,701,186 | A | 12/1997 | Huber | 359/125 |
| 5,726,784 | A | 3/1998 | Alexander et al. | 359/125 |
| 5,734,665 | A | 3/1998 | Jeon et al. | 372/6 |
| 5,757,541 | A | 5/1998 | Fidric | 359/341 |
| 5,768,012 | A | 6/1998 | Zanoni et al. | 359/341 |
| 5,798,855 | A | 8/1998 | Alexander et al. | 359/177 |
| 5,825,520 | A | 10/1998 | Huber | 359/130 |
| 5,838,700 | A | 11/1998 | Dianov et al. | 372/6 |
| 5,841,797 | A | 11/1998 | Ventrudo et al. | 372/6 |
| 5,847,862 | A | 12/1998 | Chraplyvy et al. | 359/337 |
| 5,861,981 | A | 1/1999 | Jabr | 359/341 |
| 5,880,866 | A | 3/1999 | Stolen | 359/138 |
| 5,883,736 | A | 3/1999 | Oshima et al. | 359/341 |
| 5,887,093 | A | 3/1999 | Hansen et al. | 385/27 |
| 5,920,423 | A | 7/1999 | Grubb et al. | 359/341 |

FOREIGN PATENT DOCUMENTS, insert

| | | | |
|---|---|---|---|
| WO | 98/20587 | 5/1998 | H01S/3/30 |
| EP | 0 903 876 A1 | 3/1999 | H04B/10/17 |
| EP | 0 936 761 A1 | 8/1999 | H04B/10/18 |

UNITED STATES PATENT AND TRADEMARK OFFICE
CERTIFICATE OF CORRECTION

PATENT NO.     : 6,693,737 B2
DATED          : February 17, 2004
INVENTOR(S)    : Mohammed N. Islam It is certified that error appears in the above-identified patent and that said Letters Patent is hereby corrected as shown below:

Title page (cont'd),
OTHER PUBLICATIONS, insert

-- Liaw, S-K et al., "Passive Gain-Equalized Wide-Band Erbium-Doped Fiber Amplifier Using Samarium-Doped Fiber", IEEE PHOTONICS TECHNOLOGY: LETTERS, Vol. 8, No. 7, July 7, 1996, pp. 879-881

Yamada, M. et al., "A Low-Noise and Gain-Flattened Amplifier Composed of a Silica-Based and a Fluoride-Based Er3+-Doped Fiber Amplifierin a Cascade Configuration", IEEE PHOTONICS LETTERS, Vol. 8, No. 5, May 1996, pp. 620-622

Ma, M.X. et al., "240-km Repeater Spacing in a 5280-km WDM System Experiment Using 8x2.5 Gb/s NRZ Transmission", IEEE PHOTONICS TECHNOLOGY LETTERS, Vol. 10, No. 6, June 1998, pp. 893-895

Masuda, H. et al., "Ultrawide 75-nm 3-dB Gain-Band Optical Amplification with Erbium-Doped Fluoride Fiber Amplifiers and Distributed Raman Amplifiers", IEEE PHOTONICS TECHNOLOGY LETTERS, Vol. 10, No. 4, April 1998, pp. 516-518

Masuda, H. et al., "Wide-Band and Gain Flattened Hybrid Fiber Amplifier Consisting of an EDFA and a Multiwavelength Pumped Raman Amplifier", IEEE PHOTONICS TECHNOLOGY LETTERS, Vol. 11, No. 6, June 1999, pp. 647-649

Kawai, S. et al., "UltraWide, 75nm 3dB Gain-Band Optical Amplifier Utilising Gain-Flattened Erbium-Doped Fluoride Fibre Amplifier and Discrete Raman Amplification", ELECTRONIC LETTERS, Vol. 34, No. 9, April 30, 1998, pp. 897-898

Kidorf, H. et al., "Pump Interactions in a 100-nm Bandwidth Raman Amplifier", IEEE ELECTRONICS TECHNOLOGY LETTERS, Vol. 11, No. 5, May 1999, pp. 530-532

Ono, H. et al., "Gain-Flattened Er3+-Doped Fiber Amplifier for a WDM Signal in the 1.57-1.60-µm Wavelength Region", IEEE PHOTONICS TECHNOLOGY LETTERS, Vol. 9, No. 5, May 1997, pp. 596-598

Hansen, P.B. et al., "529km Unrepeatered Transmission at 2.488 Gbit/s Using Dispersion Compensation, Forward Error Correction, and Remote Post-and Pre-amplifiers Pumped by Diode-Pumped Raman Lasers", IEEE ELECTRONICS LETTERS ONLINE NO. 19951043, July 7, 1998

Guy, M.J. et al., "Lossless Transmission of 2ps Pulses Over 45km of Standard Fibre at 1.3µm Using Distributed Raman Amplification", ELECTRONICS LETTERS, Vol. 34, No. 8, April 6, 1998, pp. 793-794

Dianov, E.M. et al., "Highly Efficient 1.3µm Raman Fibre amplifier", ELECTRONICS LETTERS, Vol. 34, No. 7, April 2, 1998, pp. 669-670

Chernikov, S.V. et al., "Raman Fibre Laser Operating at 1.24µm", ELECTRONICS LETTERS, Vol. 34, No. 7, April 2, 1998, pp. 680-681

UNITED STATES PATENT AND TRADEMARK OFFICE
CERTIFICATE OF CORRECTION

PATENT NO. : 6,693,737 B2
DATED : February 17, 2004
INVENTOR(S) : Mohammed N. Islam It is certified that error appears in the above-identified patent and that said Letters Patent is hereby corrected as shown below:

Title page (cont'd),

Yang, F.S. et al., "Demonstration of Two-Pump Fibre Optical Parametric Amplification", ELECTRONICS LETTERS, Vol. 33, No. 21, October 9, 1997, pp. 1812-1813

Kawai, S. et al., "Wide-Bandwidth and Long-Distance WDM Transmission Using Highly Gain-Flattened Hybrid Amplifier", IEEE PHOTONICS TECHNOLOGY LETTERS, Vol. 11, No. 7, July 1999, pp. 886-888

Paschotta, R. et al., "Ytterbium-Doped Fiber Amplifiers", IEEE JOURNAL OF QUANTUM ELECTRONICS, Vol. 33, No. 7, July 1997, pp. 1049-1056

Grubb, S.G. et al., "Fiber Raman Lasers Emit at Many Wavelengths", LASER FOCUS WORLD, February 1996, pp. 127-134

Mollenauer, L.F. et al., "Dispersion-Managed Solitions for Terrestrial Transmission", OPTICAL SOCIETY OF AMERICA, 1999

Hansen, S.L. et al., "Gain Limit in Erbium-Doped Fiber Amplifiers Due to Internal Rayleigh Backscattering", IEEE PHOTONICS TECHNOLOGY LETTERS, Vol. 4, No. 6, June 1992, pp. 559-561

Spirit, D.M. et al., "Systems Aspects of Raman Fibre Amplifiers", OPTICAL AMPLIFIERS FOR COMMUNICATION, Vol. 137, Pt. J, No. 4, August 1990, pp. 221-224

Mollenenauer, L.F. et al., "Soliton Propagation in Long Fibers with Periodically Compensated Loss", IEEE JOURNAL OF QUANTUM ELECTRONICS, Vol. QE-22, No. 1, January 1986, pp. 157-173

Marhic, M.E. et al., "Cancellation of Stimulated-Raman-Scattering Cross Talk in Wavelength-Division-Multiplexed Optical Communication Systems by Series or Parallel Techniques", OPTICAL SOCIETY OF AMERICA, 1998, Vol. 15, No. 3 pp. 958-963

Hansen, P.B. et al., "Rayleigh Scattering Limitations in Distributed Raman Pre-Amplifiers", IEEE PHOTONICS TECHNOLOGY LETTERS, Vol. 10, No. 1, January 1998, pp. 159-161

Ikeda, M., "Stimulated Raman Amplification Characteristics in Long Span Single-Mode Silica Fibers", OPTICS COMMUNICATIONS, Vol. 39, No. 3, 1981, pp. 148-152

Solbach, K. et al., "Performance Degradation Due to Stimulated Raman Scattering in Wavelength-Division-Multiplexed Optical-Fibre Systems", ELECTRONICS LETTERS, Vol. 19, No. 6, August 4, 1983, pp. 641-643

Grandpierre, A.G. et al., "Theory of Stimulated Raman Scattering Cancellation in Wavelength-Division-Multiplexed Systems via Spectral Inversion", IEEE PHOTONICS TECHNOLOGY LETTERS, Vol. 11, No. 10, October 1999, pp. 1271-1273

Chinn, S.R. "Analysis of Counter-Pumped Small-Signal Fibre Raman Amplifiers", ELECTRONICS LETTERS, Vol. 33, No. 7, March 27, 1997, pp. 607-608

Stolen, R.H. et al., "Raman Gain in Glass Optical Waveguides", APPL. PHYS. LETT. Vol. 22, No. 6, March 15, 1973, pp. 276-278

UNITED STATES PATENT AND TRADEMARK OFFICE
CERTIFICATE OF CORRECTION

PATENT NO. : 6,693,737 B2
DATED : February 17, 2004
INVENTOR(S) : Mohammed N. Islam It is certified that error appears in the above-identified patent and that said Letters Patent is hereby corrected as shown below:

<u>Title page (cont'd),</u>
Stolen, R. H. et al., "Development of the Stimulated Raman Spectrum in Single-Mode Silica Fibers", OPTICAL SOCIETY OF AMERICA, Vol. 1, No. 4, August 1984, pp. 662-667

Nissov, M. et al., 100 Gb/s (10x10Gb/s) WDM Transmission Over 7200 km Using Distributed Raman Amplification", CENTER FOR BROADBAND TELECOMMUNICATIONS, pp. 9-12

Takachio, N. et al., "32x10 Gb/s Distributed Raman Amplification Transmission with 50-GHz Channel Spacing in the Zero-Dispersion Region over 640km of 1.55-µm Dispersion-shifted Fiber", NTT LABS "Sugizaki, et al.," reference, after "of" delete "American", and insert -- America --.
"Inoue," reference, after "Zero-Dispersion", insert -- wavelength --.
"Tatham et al.," reference, delete "Nondegenerative", and insert -- Nondegenerate --.
"Kawai et al.," reference, after "gain-band", insert -- optical --.
"Kawai et al.," reference, delete "using", and insert -- utilizing --; and after "utilizing" delete "erium-doped", and insert -- erbium-doped --.
"Pending Provisional Patent Application;" delete "Ramam", and insert -- Raman --.
"Nissov, M., et al.," reference, after "Raman", delete "Amplifier", and insert -- Amplifiers --.

Item [57], ABSTRACT,
Line 3, after "and", delete "amplifiers", and insert -- amplifies --.

<u>Column 1,</u>
Line 57, after "of", delete "a" and insert -- an --.
Line 57, after "overlaps", delete "its".

<u>Column 3,</u>
Line 5, delete "amplifiers", and insert -- amplifies --.
Lines 14 and 25, after "wavelength", delete "$\lambda_0$", and insert -- $\lambda_0$ --.
Line 33, after "nm", insert -- . --.
Line 48, after "fiber", insert -- . --.

<u>Column 5,</u>
Line 49, after "be", insert -- a --.

UNITED STATES PATENT AND TRADEMARK OFFICE
CERTIFICATE OF CORRECTION

PATENT NO. : 6,693,737 B2
DATED : February 17, 2004
INVENTOR(S) : Mohammed N. Islam It is certified that error appears in the above-identified patent and that said Letters Patent is hereby corrected as shown below:

Column 7,
Line 42, after "can", delete "falls", and insert -- fall --.
Line 48, after "$\lambda_p$", delete "$\lambda_0$", and insert -- $\lambda_0$ --.

Column 8,
Line 64, after "13.2", delete "Thz", and insert -- THz --.

Column 12,
Line 35, after "and", delete "a", and insert -- an --.

Column 13,
Line 40, after "wavelength", delete "$\lambda_0$", and insert -- $\lambda_0$ --.
Line 44, delete "mn", and insert -- nm --.
Line 44, after "the", delete "$\lambda_0$", and insert -- $\lambda_0$ --.
Line 46, after "of", delete "$\lambda_0$", and insert -- $\lambda_0$ --.
Lines 52 and 53, after "have", delete "$\lambda_0$", and insert -- $\lambda_0$ --.

Column 15,
Line 13, after "km", delete "—$^1$", and insert -- $^{-1}$ --.
Line 22, after "have", delete "$\lambda_0$", and insert -- $\lambda_0$ --.
Lines 22 and 24, after "have", delete "$\lambda_0$", and insert -- $\lambda_0$ --.
Line 26, delete "$\lambda_0$", and insert -- $\lambda_0$ --.
Line 53, after the first "wave", insert a -- - --.
Line 65, after "$|\lambda$—" delete "$\lambda_0$", and insert -- $\lambda_0$ --.

Column 16,
Line 44, after "wave", insert a -- - --.
Line 53, after "wavelength", delete "A", and insert -- $\lambda$ --.

Column 17,
Line 4, after "wave", insert a -- - --.
Line 5, delete "A", an insert -- $\lambda$ --.
Line 24, after "of", delete "a", and insert -- an --.
Line 36, after "50", delete "ps/fm-km", and insert -- ps/nm-km --.

Column 18,
Line 22, after "20", delete "mn", and insert -- nm --.

UNITED STATES PATENT AND TRADEMARK OFFICE
CERTIFICATE OF CORRECTION

PATENT NO. : 6,693,737 B2
DATED : February 17, 2004
INVENTOR(S) : Mohammed N. Islam It is certified that error appears in the above-identified patent and that said Letters Patent is hereby corrected as shown below:

Column 19,
Line 34, after "wavelength", delete "$\lambda_0$", and insert -- $\lambda_0$ --.

Column 20,
Line 17, after "wavelength", delete "$\lambda_0$", and insert -- $\lambda_0$ --.
Line 23, after "50", delete "ps/nm-kin", and insert -- ps/nm-km --.
Line 50, after "14", insert -- , --.

Column 21,
Line 19, delete "ps/nm-kin", and insert -- ps/nm-km --.
Line 30, after the first "wherein", delete "wherein"
Line 35, after the first "of", delete "claims" and insert -- claim --.
Line 37, after "31", insert -- wherein --.
Line 45, after "$\lambda$", delete "is".

Column 22,
Line 13, after "50", delete "ps/nm-kin", and insert -- ps/nm-km --.
Line 25, after the first "wherein", delete "wherein".
Line 39, delete "comprised", and insert -- comprises --.
Line 39, after "$\lambda$", delete "is".

Signed and Sealed this

Twenty-eighth Day of September, 2004

JON W. DUDAS
*Director of the United States Patent and Trademark Office*